(12) United States Patent
Anthony et al.

(10) Patent No.: US 6,606,011 B2
(45) Date of Patent: *Aug. 12, 2003

(54) ENERGY CONDITIONING CIRCUIT ASSEMBLY

(75) Inventors: Anthony A. Anthony, Erie, PA (US);
William M. Anthony, Erie, PA (US);
Kenneth W. Musil, Erie, PA (US)

(73) Assignee: X2Y Attenuators, LLC, Santa Monica, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/999,787

(22) Filed: Oct. 24, 2001

(65) Prior Publication Data

US 2002/0113663 A1 Aug. 22, 2002

Related U.S. Application Data

(63) Continuation of application No. 09/561,283, filed on Apr. 28, 2000, which is a continuation-in-part of application No. 09/600,530, filed as application No. PCT/US99/01040 on Jan. 16, 1999, and a continuation-in-part of application No. 09/286,812, filed on Apr. 6, 1999, now abandoned, which is a continuation-in-part of application No. 09/056,436, filed on Apr. 7, 1998, now abandoned.

(51) Int. Cl.[7] .................................................. H04B 3/28
(52) U.S. Cl. ............................ 333/12; 333/182; 361/58
(58) Field of Search .................................. 333/182, 185, 333/12; 361/58, 113, 118

(56) References Cited

U.S. PATENT DOCUMENTS

| | | |
|---|---|---|
| 3,790,858 A | 2/1974 | Brancaleone et al. |
| 3,842,374 A | 10/1974 | Schlicke |
| 4,139,783 A | 2/1979 | Engeler |
| 4,262,317 A | 4/1981 | Baumbach |
| 4,335,417 A | 6/1982 | Sakshaug et al. |
| 4,682,129 A | 7/1987 | Bakermans et al. |
| 4,688,151 A | 8/1987 | Kraus et al. |
| 4,772,225 A | 9/1988 | Ulery |
| 4,789,847 A | 12/1988 | Sakamoto et al. |
| 4,814,295 A | 3/1989 | Mehta |
| 4,587,589 A | 5/1989 | Marek |
| 4,967,315 A | 10/1990 | Schelhorn |
| 5,059,140 A | 10/1991 | Philippson et al. |

(List continued on next page.)

*Primary Examiner*—Robert Pascal
*Assistant Examiner*—Kimberly Glenn
(74) *Attorney, Agent, or Firm*—Robert J. Clark; Hahn Loeser & Parks, LLP

(57) ABSTRACT

The present invention is a component carrier (132) consisting of a plate of insulating material having a plurality of apertures (140) for accepting the leads of a thru-hole differential and common mode filter (130). Another embodiment consists of a surface mount component carrier (10) comprising a disk (16) of insulating material having a plurality of apertures (24). The same concept for the above described carrier is also incorporated into several alternate embodiments, either independently, embedded within electronic connectors. The overall configuration and electrical characteristics of the concepts underlying the present inventions are also described as an energy conditioning circuit assembly which encompasses the combination of differential and common mode filters and component carriers optimized for such filters. The various embodiments of component carriers provide increased physical support and protection to differential and common mode filters and substantially improve the electrical characteristics of the filters due to the increased shielding provided by the carriers. Embodiments of the carrier energy conditioning assembly include integrated circuit construction for a differential and common mode filter coupled to the power bus of an integrated circuit.

20 Claims, 14 Drawing Sheets

U.S. PATENT DOCUMENTS

| | | |
|---|---|---|
| 5,065,284 A | 11/1991 | Hernandez |
| 5,079,069 A | 1/1992 | Howard et al. |
| 5,140,497 A | 8/1992 | Kato et al. |
| 5,142,430 A | 8/1992 | Anthony |
| 5,155,655 A | 10/1992 | Howard et al. |
| 5,161,086 A | 1/1993 | Howard et al. |
| 5,181,859 A | 1/1993 | Foreman et al. |
| 5,186,647 A | 2/1993 | Denkmann et al. |
| 5,236,376 A | 8/1993 | Cohen |
| 5,243,308 A | 9/1993 | Shusterman et al. |
| 5,251,092 A | 10/1993 | Brady et al. |
| 5,261,153 A | 11/1993 | Lucas |
| 5,268,810 A | 12/1993 | DiMarco et al. |
| 5,290,191 A | 3/1994 | Foreman et al. |
| 5,299,956 A | 4/1994 | Brownell et al. |
| 5,310,363 A | 5/1994 | Brownell et al. |
| 5,311,408 A | 5/1994 | Ferchau et al. |
| 5,321,373 A | 6/1994 | Shusterman et al. |
| 5,321,573 A | 6/1994 | Person et al. |
| 5,326,284 A | 7/1994 | Bohbot et al. |
| 5,337,028 A | 8/1994 | White |
| 5,353,189 A | 10/1994 | Tomlinson |
| 5,353,202 A | 10/1994 | Ansell et al. |
| 5,362,249 A | 11/1994 | Carter |
| 5,362,254 A | 11/1994 | Siemon et al. |
| 5,396,201 A | 3/1995 | Ishizaki et al. |
| 5,414,393 A | 5/1995 | Rose et al. |
| 5,414,587 A | 5/1995 | Kiser et al. |
| 5,432,484 A | 7/1995 | Klas et al. |
| 5,446,625 A | 8/1995 | Urbish et al. |
| RE35,064 E | 10/1995 | Hernandez |
| 5,455,734 A | 10/1995 | Foreman et al. |
| 5,477,933 A | 12/1995 | Nguyen |
| 5,483,407 A | 1/1996 | Anastasio et al. |
| 5,500,629 A | 3/1996 | Meyer |
| 5,500,785 A | 3/1996 | Funada |
| 5,512,196 A | 4/1996 | Mantese et al. |
| 5,535,101 A | 7/1996 | Miles et al. |
| 5,555,150 A | 9/1996 | Newman, Jr. |
| 5,568,348 A | 10/1996 | Foreman et al. |
| 5,586,007 A | 12/1996 | Funada |
| 5,592,391 A | 1/1997 | Muyshondt et al. |
| 5,640,048 A | 6/1997 | Selna |
| 5,700,167 A | 12/1997 | Pharney et al. |
| 5,751,539 A | 5/1998 | Stevenson et al. |
| 5,767,446 A | 6/1998 | Ha et al. |
| 5,797,770 A | 8/1998 | Davis et al. |
| 5,808,873 A | 9/1998 | Celaya et al. |
| 5,825,628 A | 10/1998 | Garbelli et al. |
| 5,828,093 A | 10/1998 | Naito et al. |
| 5,838,216 A | 11/1998 | White et al. |
| 5,880,925 A | 3/1999 | DuPre et al. |
| 5,889,445 A | 3/1999 | Ritter et al. |
| 5,909,350 A | 6/1999 | Anthony |
| 6,018,448 A | 1/2000 | Anthony |
| 6,034,864 A | 3/2000 | Naito et al. |
| 6,038,121 A | 3/2000 | Naito et al. |
| 6,072,687 A | 6/2000 | Naito et al. |
| 6,097,581 A | 8/2000 | Anthony |
| 2002/0075096 A1 * | 6/2002 | Anthony ............... 333/34 |

* cited by examiner

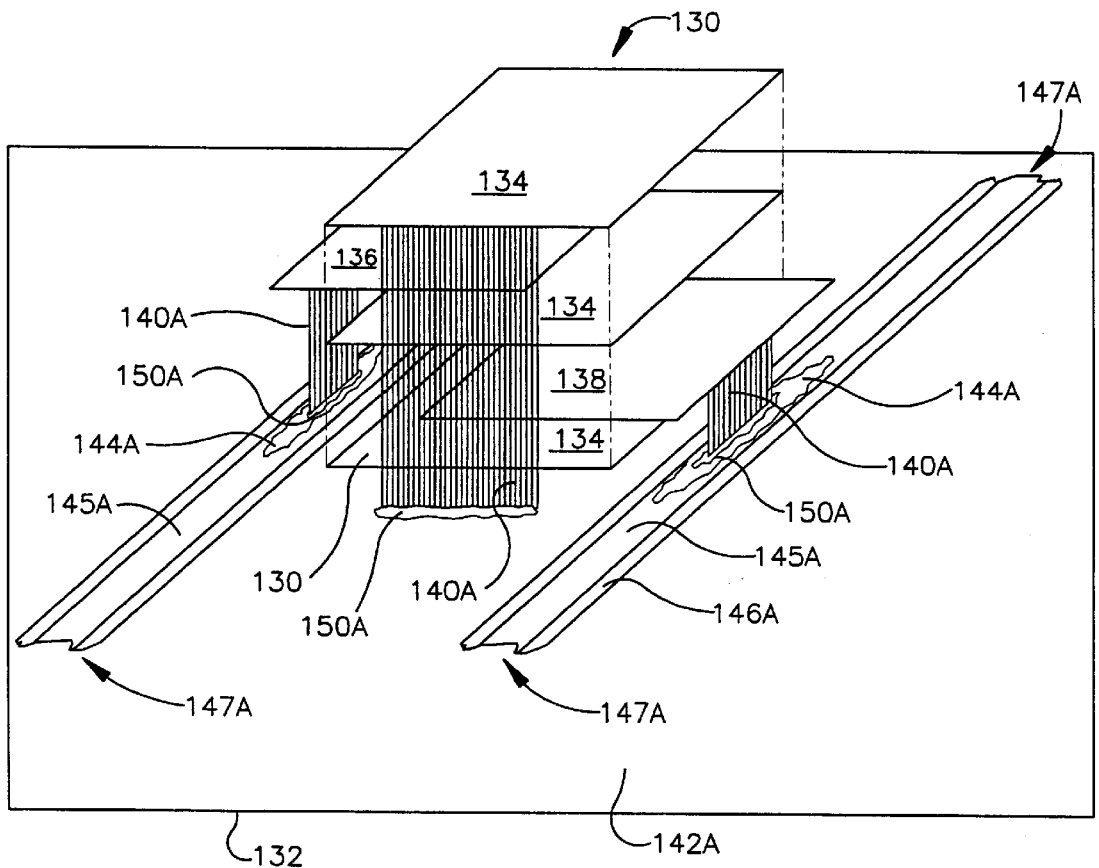
FIG.—1B

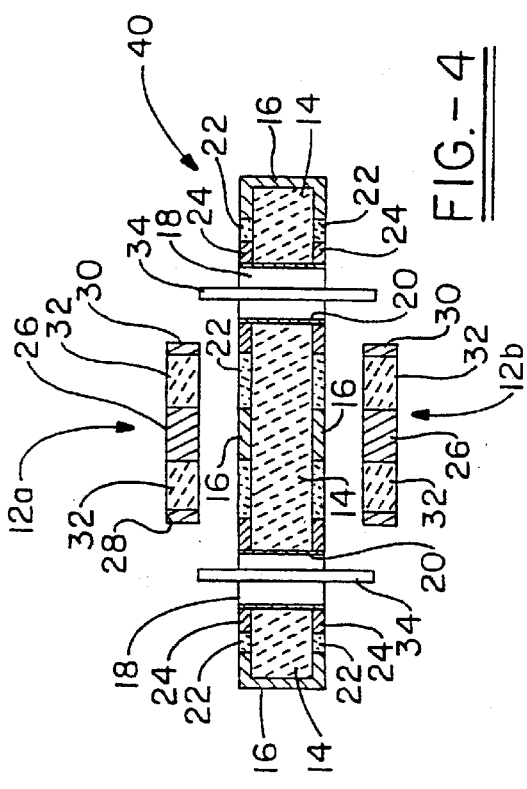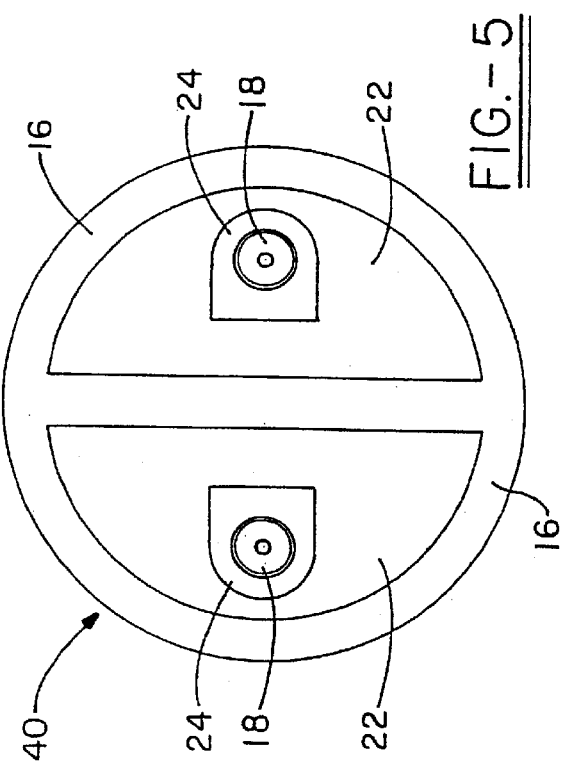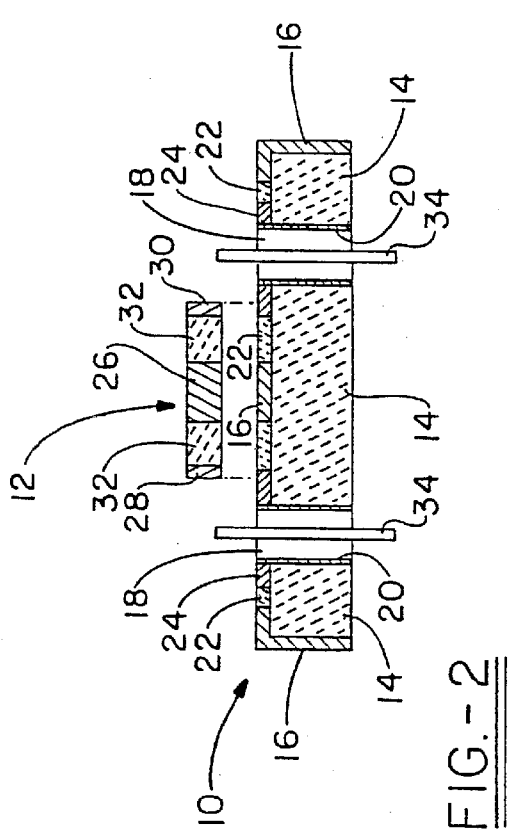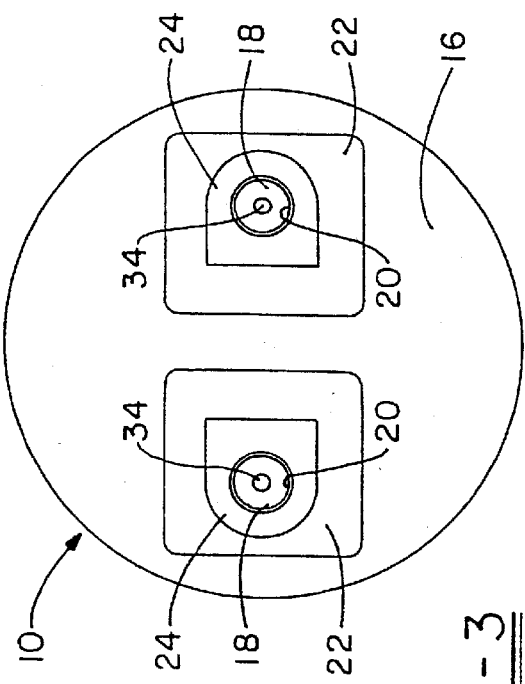

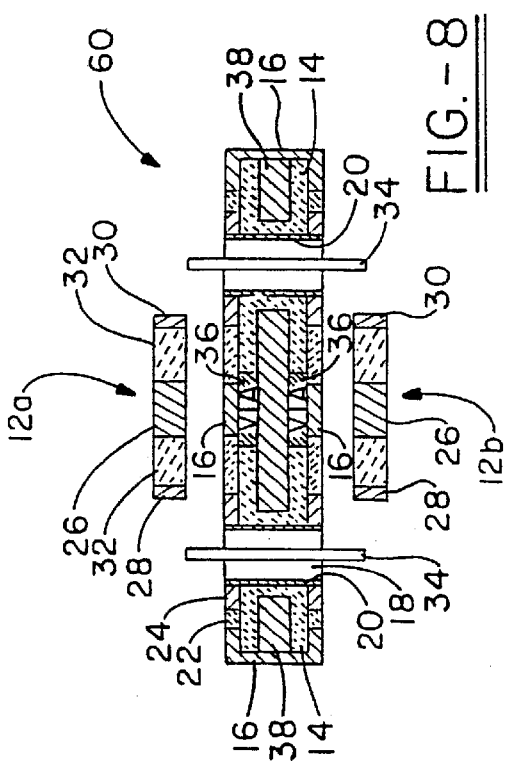
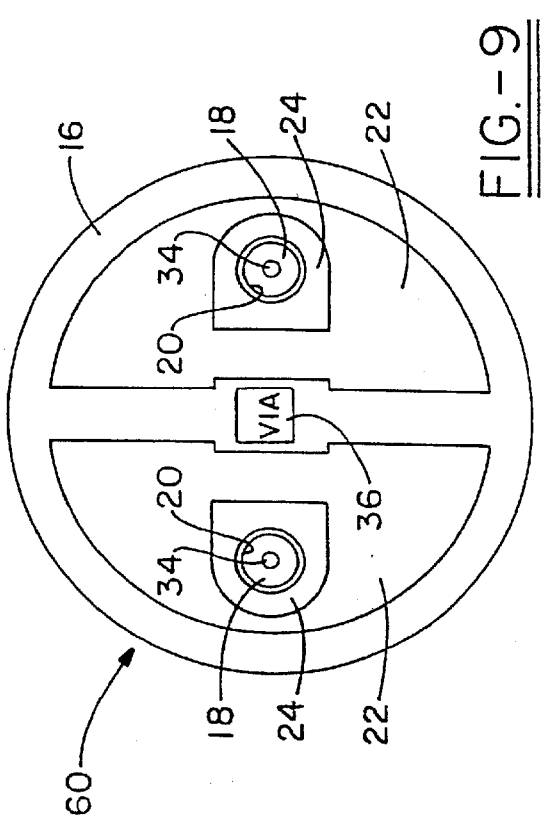
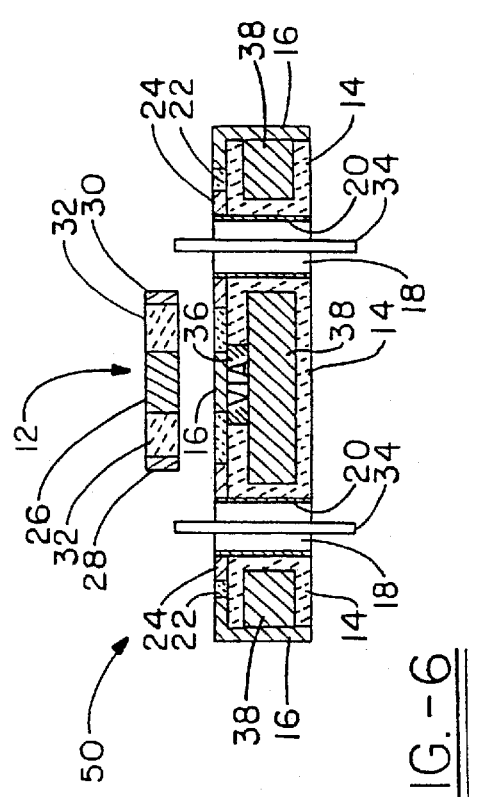
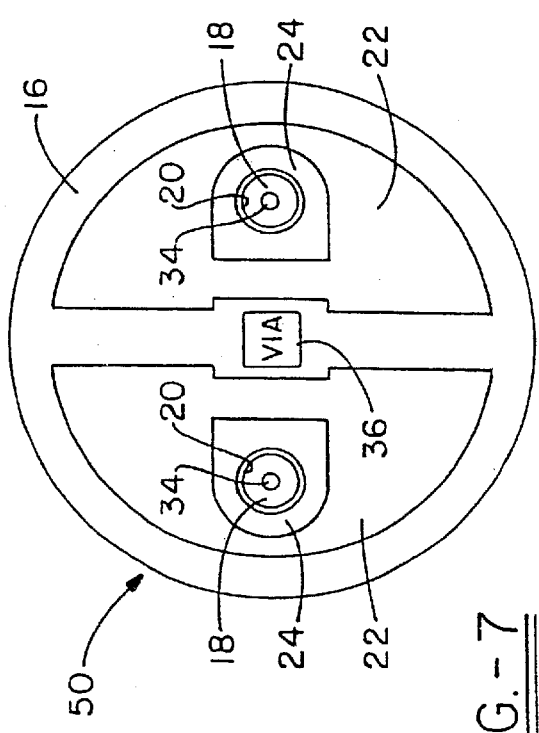

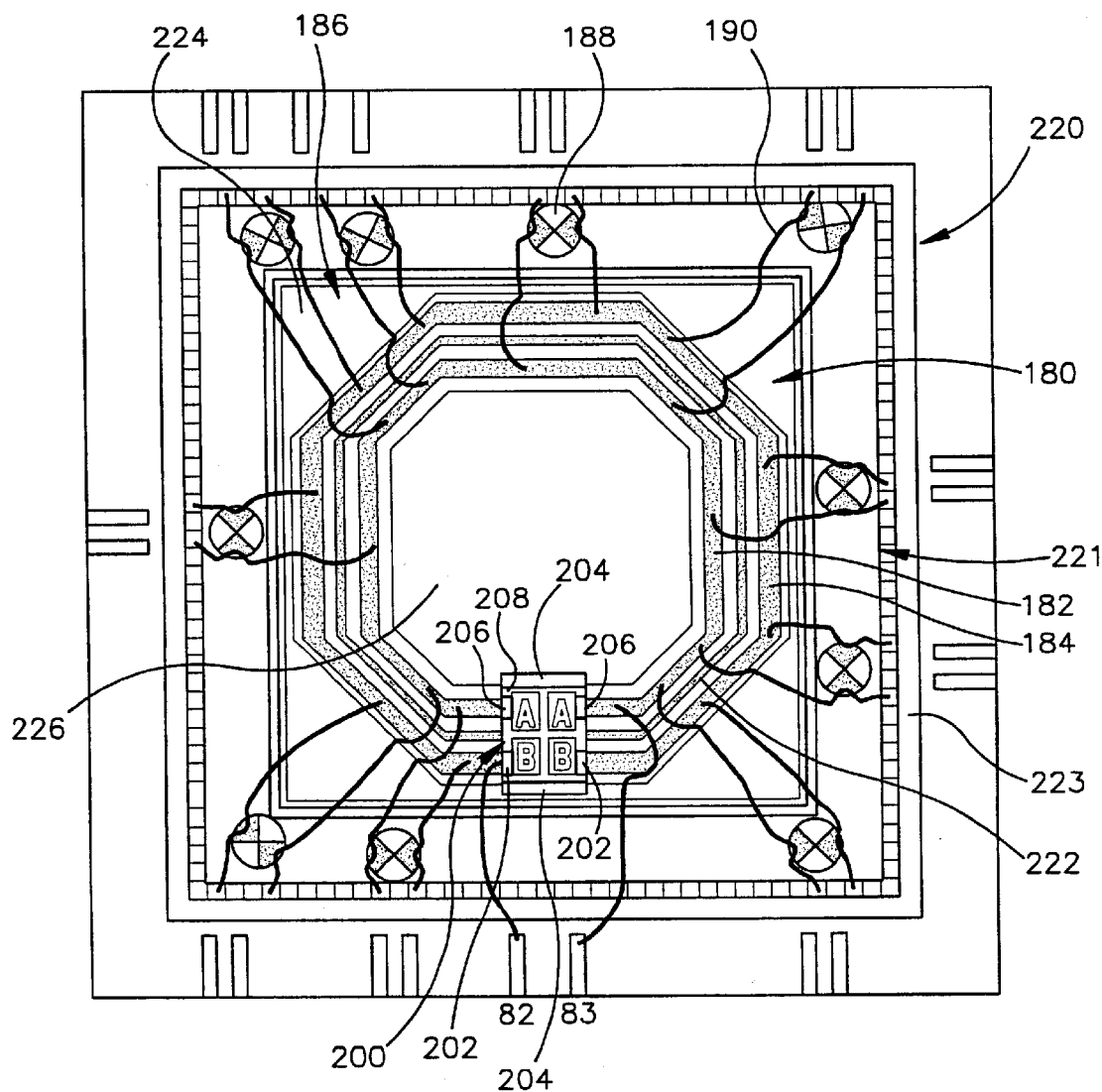
FIG.—14A
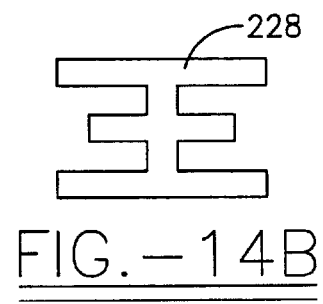
FIG.—14B

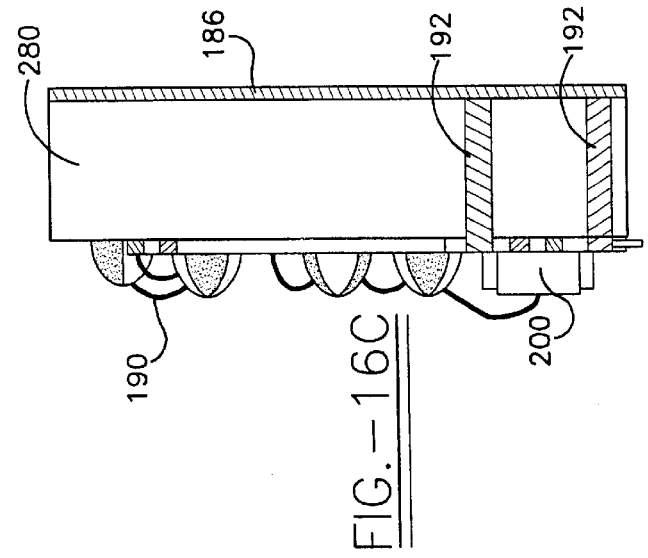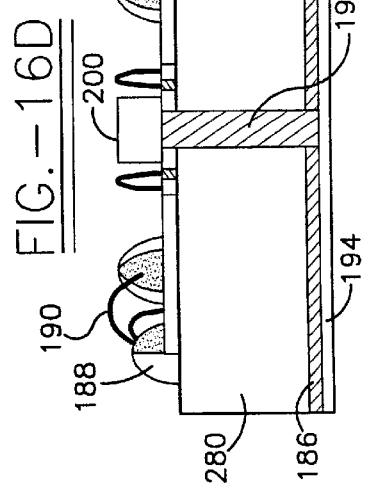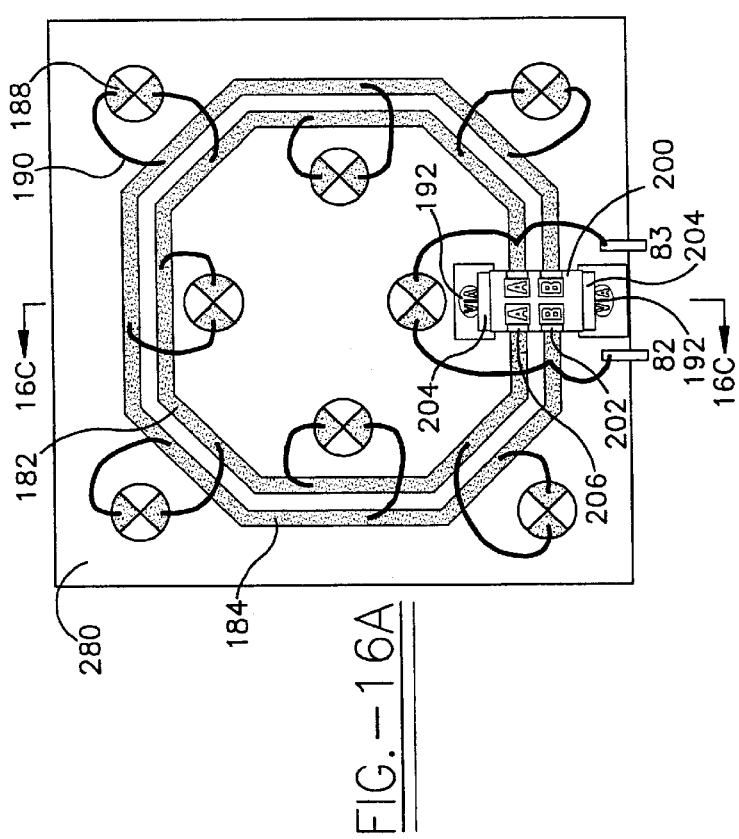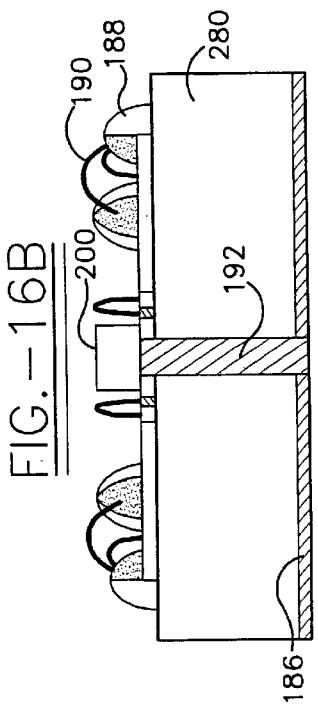

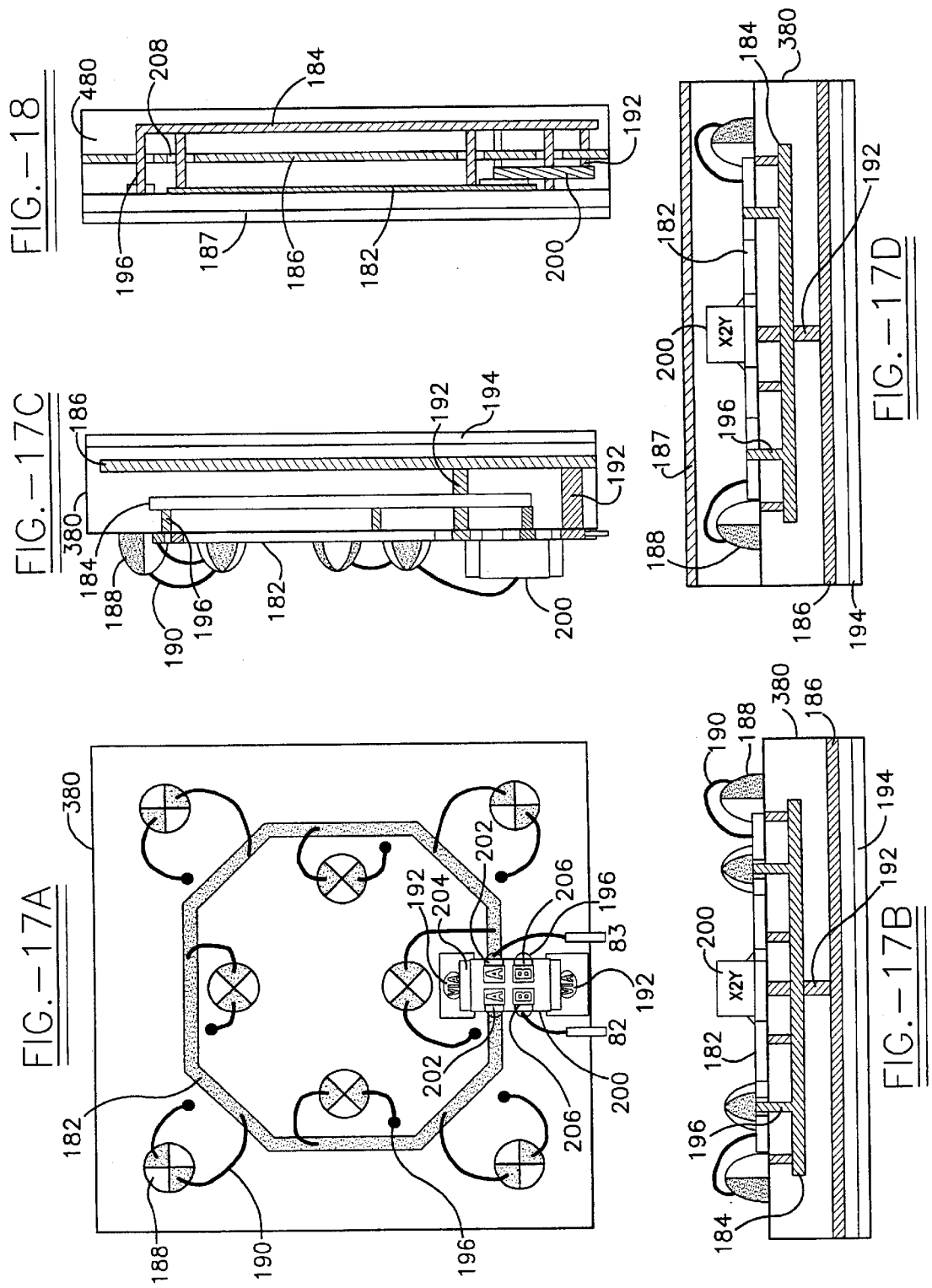

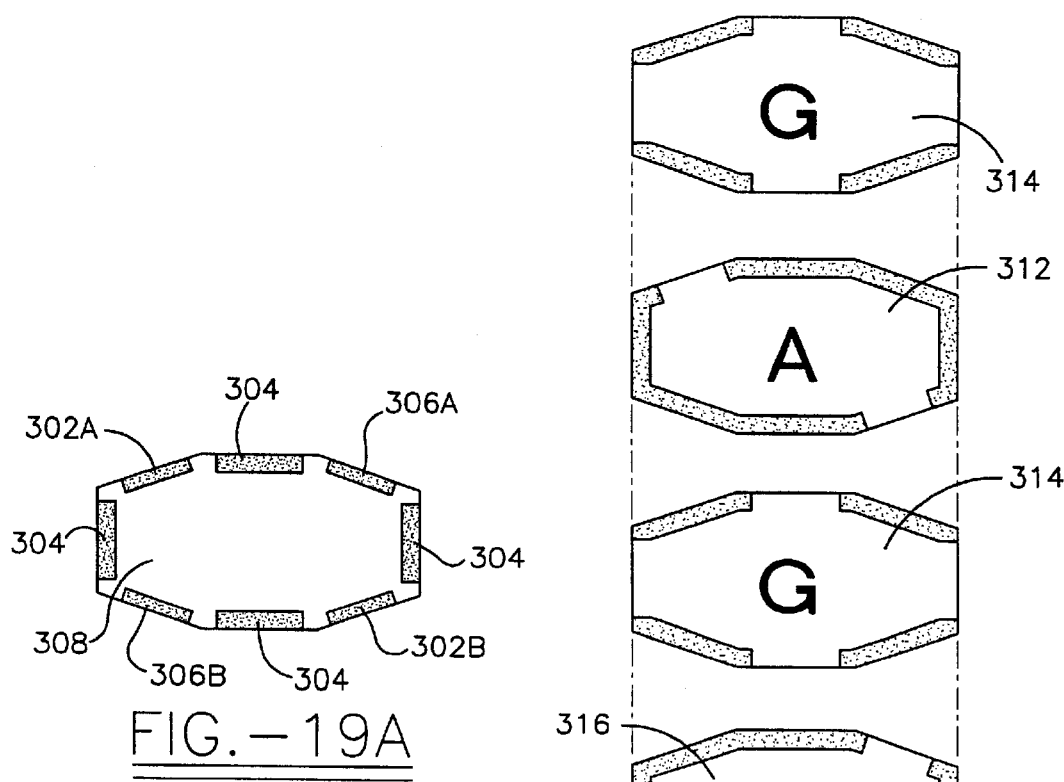
FIG.-19A
FIG.-19B
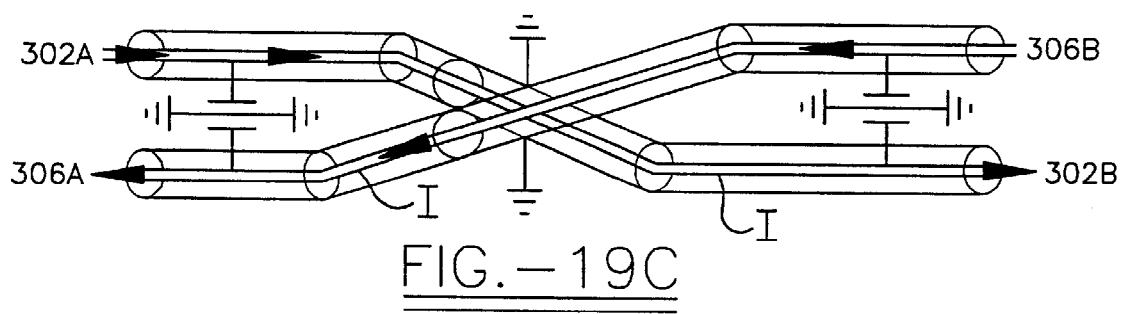
FIG.-19C

ENERGY CONDITIONING CIRCUIT ASSEMBLY

This application is a continuation of U.S. patent application Ser. No. 09/561,283 filed Apr. 28,2000, which is a continuation-in-part of application Ser. No. 09/600,530 filed Jul. 18, 2000, which is a U.S. national stage application of international application PCT/US99/01040 filed Jan. 16, 1999; this application is also a continuation-in-part of U.S. patent application, Ser. No. 09/286,812 filed Apr. 6, 1999, now abandoned, which is a continuation-in-part of U.S. patent application, Ser. No. 09/056,436 filed Apr. 7, 1998, now abandoned.

TECHNICAL FIELD

The invention includes the use of energy conditioning assemblies, pathway intersections and layered architectures such as those described and claimed in commonly owned U.S. Pat. No. 5,909,350, U.S. Pat. No. 6,018,448, and U.S. Pat. No. 6,097,581, all incorporated herein by reference. A series of preferred embodiments are directed to energy conditioning that occurs when unenergized elements are combined and electrified to act as part of a circuit that provides conditioned energy to an integrated circuit or any other active energy loads within electronic equipment or systems. The present invention also provides electrical interference suppression and/or shielding for improved performance of active electronic components located within larger electronic systems.

BACKGROUND OF THE INVENTION

The majority of electronic equipment produced presently, and in particular computers, communication systems, military surveillance equipment, stereo and home entertainment equipment, televisions and other appliances include miniaturized components to perform new high speed functions and electrical interconnections which according to the materials from which they are made or their mere size are very susceptible to stray electrical energy created by electromagnetic interference or voltage transients occurring on electrical lines. Voltage transients can severely damage or destroy such micro-electronic components or contacts thereby rendering the electronic equipment inoperative, and requiring extensive repair and/or replacement at great cost. Based upon the foregoing there was found a need to provide a multi-functioning electronic component architecture which attenuates electromagnetic emissions resulting from differential and common mode currents flowing within electronic circuits, single lines, pairs of lines and multiple twisted pairs. Such multi-functioning electronic components are the subject of commonly owned U.S. Pat. No. 5,909,350, U.S. Pat. No. 6,097,581, and U.S. Pat. No. 6,018,448, all incorporated herein by reference.

While the above referenced electronic components accomplish their respective tasks, usage of such components has been limited for a number of reasons. First, the number of such components required continues to increase as applications, such as data buses, continue to grow. In addition, as the number of required components grows, so does the physical size of multi-component packages. Second, by their nature the electronic components referred to are delicate structures which do not handle physical stress well. During the manufacture of electronic products a number of mechanical stresses associated with handling and soldering can damage the components.

Another drawback to using the referenced electronic components is that it becomes very tedious to manually handle and mount the components on electronic products being assembled. This often time translates into lower product yields and added expense due to broken or misconnected components. A further disadvantage to some of the components is that they include leads for thru-hole insertion. Physical stressing, bending or applying torque to the leads can cause a failure in the final product, either immediately or later thereby affecting the products overall reliability.

Another source of electrical noise found in prior art differential mode filters, common mode filters and capacitor decouplers is caused by imperfections in the capacitors that make up the filters and decouplers. The effects of these imperfections are commonly referred to as parasitic effects. Parasitic or non-ideal capacitor behavior can manifest itself in the form of resistive and inductive elements, nonlinearity and dielectric memory. The four most common effects are leakage or parallel resistance, equivalent series resistance (ESR), equivalent series inductance (ESL) and dielectric absorption. The equivalent series resistance (ESR) of a capacitor is the resistance of the capacitor leads in series with the equivalent resistance of the capacitor plates. ESR causes the capacitor to dissipate power during high flowing ac currents. The equivalent series inductance (ESL) of a capacitor is the inductance of the capacitor leads in series with the equivalent inductance of the capacitor plates. An additional form of parasitic that goes beyond the component itself is stray capacitance which is attributed to the attachment of the capacitor element within an electrical circuit. Stray capacitors are formed when two conductors are in close proximity to each other and are not shorted together or screened by a Faraday shield. Stray capacitance usually occurs between parallel traces on a PC board or between traces/planes on opposite sides of a PC board. Stray capacitance can cause problems such as increased noise and decreased frequency response.

Several other sources of electrical noise include cross talk and ground bounce. Cross talk in most connectors or carriers is usually the result of mutual inductance between two adjacent lines rather than from parasitic capacitance and occurs when signal currents follow the path of least inductance, especially at high frequencies, and return or couple onto nearby conductors such as conductive tracks positioned parallel with or underneath the signal current track. Ground bounce is caused by shifts in the internal ground reference voltage due to output switching of a component. Ground bounce causes false signals in logic inputs when a device output switches from one state to another. It has been found that the multi-functioning electronic components, specifically the differential and common mode filters and decouplers disclosed in the above referenced, commonly owned U.S. patent applications, provide improved performance when coupled or used with an enlarged ground shield that can substantially decrease or reduce and in some cases can eliminate capacitor parasitics, stray capacitance, mutual inductive coupling between two opposing conductors, various forms of cross talk and ground bounce.

Therefore, in light of the foregoing deficiencies in the prior art, the applicant's invention is herein presented.

SUMMARY OF THE INVENTION

Based upon the foregoing, there has been found a need to provide a component carrier for maintaining one or more surface mount components.

It is also an object of the present invention to provide a component carrier having an enhanced ground surface which improves the functional characteristics of surface mount components coupled to the component carrier.

It is a further object of the present invention to provide a component carrier adapted specifically to receive a differential and common mode filter and decoupler as disclosed in the above referenced, commonly owned pending U.S. patent applications.

It is a further object of the present invention to provide a component carrier having an enhanced ground surface which improves the functional characteristics of differential and common mode filters and decouplers as disclosed in the above referenced, commonly owned pending U.S. patent applications.

It is a further object of the present invention to provide an energy conditioning circuit assembly that combines a component carrier with a differential and common mode filter and decoupler as disclosed in the above referenced, commonly owned pending U.S. patent applications to thereby provide simultaneous filtering of common and differential mode interference, suppression of parasitic or stray capacitance, mutual inductive coupling between two adjacent conductors and circuit decoupling from a single assembly.

It is another object of the present invention to provide an integrated circuit package for a differential and common mode filter coupled to the power bus lines servicing the integrated circuit.

These and other objects and advantages of the present invention are accomplished through the use of various embodiments of a component carrier which receives either a thru-hole or surface mount differential and common mode filter and decoupler as disclosed in the above referenced, commonly owned U.S. patents and pending U.S. patent applications (hereinafter referred to as "differential and common mode filter" or "layered architecture").

One embodiment comprises a carrier that also provides the added benefit of improved shielding from electromagnetic interference and over voltage dissipation due to the surface area of the metalized ground surface.

The same concept for the above described a carrier is also incorporated into several alternate embodiments, either independently, embedded within. The overall configuration and electrical characteristics of the concepts underlying the present inventions are also described as a conditioning assembly (also referred to as an energy conditioning circuit assembly or "ECCA") which encompasses the combination of differential and common mode filters and component carriers optimized for such filters.

These along with other objects and advantages of the present invention will become more readily apparent from a reading of the detailed description taken in conjunction with the drawings and the claims.

BRIEF DESCRIPTION OF THE DRAWINGS

FIG. 1B is a perspective, exploded view of a differential and common mode filter coupled to a portion of a carrier circuit;

FIG. 2 is an elevational view in cross section of a single-sided surface mount component carrier of the present invention;

FIG. 3 is a top plan view of the surface mount component carrier shown in FIG. 2; FIG. 4 is an elevational view in cross section of a double-sided surface mount component carrier of the present invention;

FIG. 5 is a top plan view of the surface mount component carrier shown in FIG. 4;

FIG. 6 is an elevational view in cross section of an alternate embodiment of a single-sided surface mount component carrier of the present invention;

FIG. 7 is a top plan view of the surface mount component carrier shown in FIG. 6;

FIG. 8 is an elevational view in cross section of an alternate embodiment of a double-sided surface mount component carrier of the present invention;

FIG. 9 is a top plan view of the surface mount component carrier shown in FIG. 8;

FIG. 14A is a top plan view of a carrier energy conditioning circuit assembly comprising a differential and common mode filter mounted on a single layer substrate carrier within an integrated circuit package; and FIG. 14B is a top plan view of a single point ground area located beneath the differential and common mode filter in FIG. 14A;

FIG. 16A is a top plan view of a two layer substrate carrier having a differential and common mode filter mounted to bus traces on a top surface of the carrier; and FIG. 16B is a front cross-sectional view of the two layer substrate carrier of FIG. 16A; and FIG. 16C is a side sectional view of the two layer substrate carrier of FIG. 16A; and FIG. 16D is a front cross-sectional view of an alternate embodiment of the two layer substrate carrier of FIG. 16A which includes an insulation layer;

FIG. 17A is a top plan view of a three layer substrate carrier having a differential and common mode filter mounted to power bus traces on a top surface of the carrier; and FIG. 17B is a front cross-sectional view of the three layer substrate carrier of FIG. 17A; and FIG. 17C is a side sectional view of the three layer substrate carrier of FIG. 17A; and FIG. 17D is a front cross-sectional view of the three layer substrate carrier of FIG. 17A including a top potting layer;

FIG. 18 is a side sectional view of a multi-layer substrate carrier having a differential and common mode filter embedded on a layer within the substrate;

FIG. 19A is a top plan view of a shielded twisted pair feed through differential and common mode filter; and FIG. 19B is a top plan view of the coplanar elements that comprise the shielded twisted pair feed through differential and common mode filter of FIG. 19A; and FIG. 19C and FIG. 19D are schematic representations of a shielded twisted pair feed through differential and common mode filter showing differential noise cancellation.

DETAILED DESCRIPTION OF THE PREFERRED EMBODIMENTS

Figure 1A:
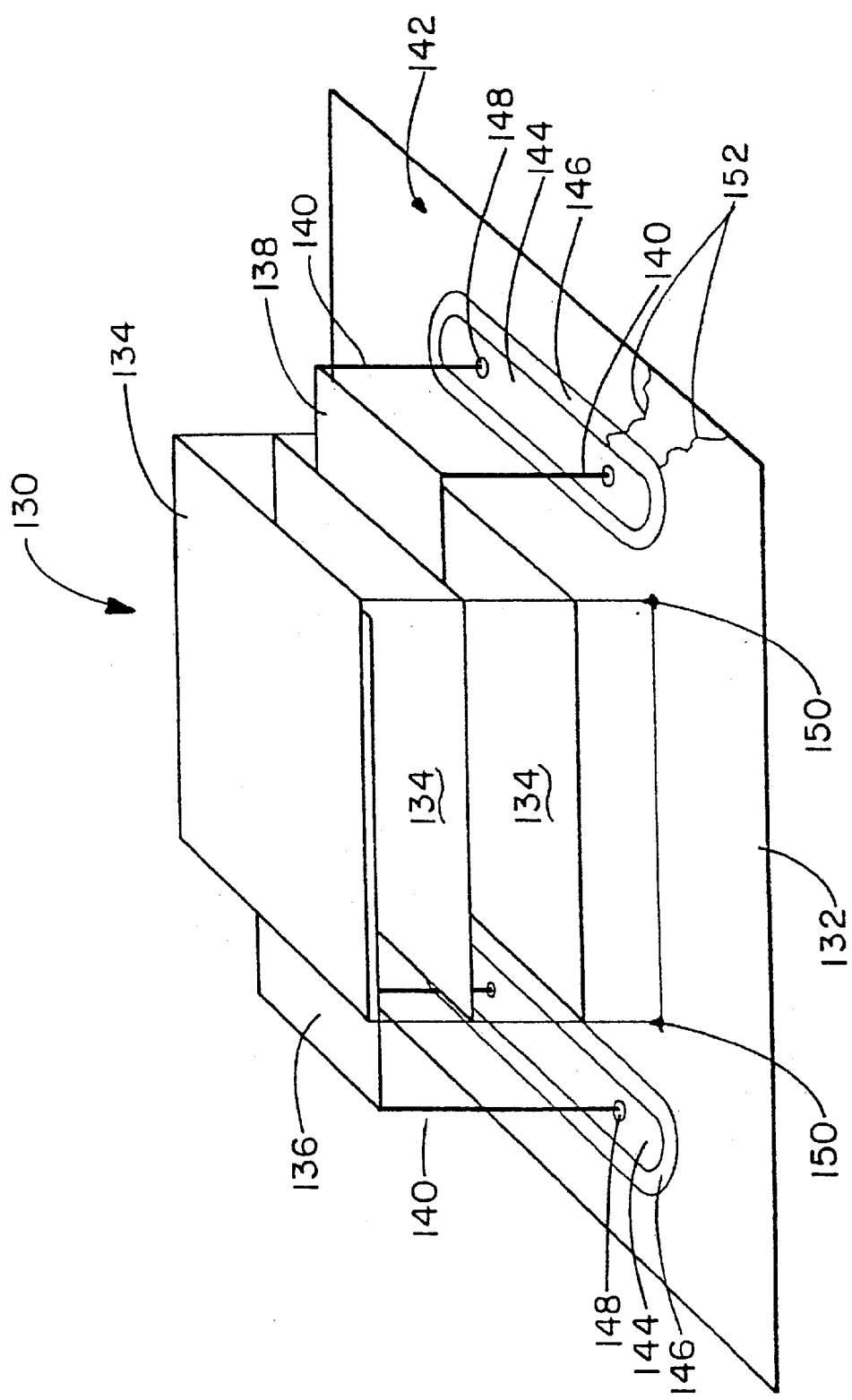
FIG. 1A is a perspective, exploded view of a thru-hole differential and common mode filter coupled to a portion of the thru-hole component carrier of the present invention.

FIG. 1A shows the present invention in its simplest form. Component carrier 132 is shown coupled with a differential and common mode filter 130 having thru-hole leads 140 for electrical coupling to carrier 132. Differential and common mode filter 130 is disclosed in commonly owned U.S. Pat. No. 5,909,350 (Ser. No. 08/841,940); U.S. Pat. No. 6,097,581 (Ser. No. 09/008,769); and U.S. Pat. No. 6,018,448 (Ser. No. 09/056,379), incorporated herein by reference. Briefly, the structure of differential and common mode filter 130 will be described. Filter 130 consists of a first electrode 136 and a second electrode 138 which are separated by and electrically isolated from a plurality of ground layers 134 and each other by a dielectric medium. The particular architecture creates a line-to-line capacitor and two line-to-ground capacitors which provide for differential and common mode filtering and decoupling.

Because filter 130 is a somewhat fragile component, component carrier 132 provides a physical support to which filter 130 is electrically coupled. The first and second electrodes 136 and 138 each have conductive leads 140 which are inserted into apertures 148 of conductive pads 144. Each conductive pad 144 is electrically isolated from the conductive surface 142 of component carrier 132 by insulating bands 146. Not only does component carrier 132 provide additional physical strength to differential and common mode filter 130 but it also acts as a ground shield which substantially improves the electrical characteristics of filter 130. When filter 130 is properly coupled to carrier 132 the plurality of ground layers 134 are electrically coupled to one another and then coupled to conductive surface 142 by any number of means known by those of ordinary skill in the art. One common means of electrical coupling is through the use of solder 150 points connecting portions of the ground layers 134 to conductive surface 142. One advantage to the relatively large conductive surface 142 of component carrier 132 is that if cracks 152 or electrical openings form on conductive surface 142 its shielding effect is not lost.

FIG. 1B shows an alternate version of the present invention in its simplest form. The difference in FIG. 1B as compared to FIG. 1A is that the carrier 132' of FIG. 1B has a pair of circuit traces 145A insulated from conductive surface 142A by insulating bands 146A. First electrode 136 and second electrode 138 are each electrically connected through conductor 140A to a solder pad 144A on one of the circuit traces 145A and coupled thereto by solder 150A. Ground layers 134 are electrically connected through conductor 140A to conductive surface 142A.

Both embodiments shown in FIGS. 1A and 1B disclose a layered architecture (differential and common mode filter 130) in combination with a conductive substrate (carrier 132) that comprises an energy conditioning circuit assembly (hereinafter "ECCA"). When the ECCA is coupled between an energy source and an active load, the ECCA simultaneously receives and conditions energy propagating to the load in a differentially balanced manner. The ECCA of the present invention is disclosed in a plurality of embodiments, which will be described subsequently. Each embodiment of the ECCA simultaneously receives and conditions energy when coupled between an active load and an energy source. The conditioning functions provided by the ECCA are facilitated, in part, by the electrical connection of the common conductive electrodes (ground layers 134) of the layered architecture with an external conductive path provided by the conductive substrate. The conductive substrate is positioned apart from the differentially energized electrodes of the layered architecture. The common conductive electrodes alone or in combination with the conductive substrate are normally electrically coupled to an energy return path, i.e., ground. Depending upon the intended application of the ECCA, the common conductive electrodes and/or the conductive substrate may be connected to a circuit ground or return, an isolated ground, a chassis ground, or earth ground. As a person of ordinary skill in the art would understand, the energy return path could be any desired reference including an offset reference in either the positive or negative direction, as used for inverted digital logic for example. For simplicity, the term ground will be used generally but is not intended to be limited to any one particular electrical reference point.

When one or more pairs of differential electrodes (first and second electrodes 136 and 138 respectively) of the layered architecture are electrically connected to external energy pathways or planes, i.e., electrical connections to and from a power source and load, and energy is applied to the pathways the ECCA simultaneously performs energy conditioning and decoupling. Depending upon the type of energy source and load, the ECCA may perform only energy conditioning or decoupling, although in many applications it will perform both upon propagating energy simultaneously.

The ECCA can receive and source energy along multiple external energy pathways. Energy will also propagate within the layered architecture in a balanced manner, meaning the reactance of the propagated energy will be approximately equal. Due to the unique arrangement of the ECCA, energy received and conditioned provides an active load with a defacto constant energy source which can be drawn upon by the active load.

The ECCA also effectively minimizes loop currents that would otherwise exist in the energy pathways or planes coupled to the loads. Because the common conductive electrodes of the layered architecture are electrically connected to the larger conductive area of the conductive substrate, the larger conductive area becomes an extension of the common conductive electrodes found within the layered architecture. When coupled to an active load, for example the silicon wafer of an integrated circuit, the conductive substrate will be positioned such that it nearly comes in contact with the active load thereby minimizing the distance of separation or loop area. This close positioning relationship of the active load, the conductive substrate, and the layered architecture minimizes the current loop path of the differentially energized electrodes, which are separated by dielectric medium. The larger conductive area or extension provided to the common conductive electrodes functions as an enveloping shield that decreases electrostatic energy. The combination that makes up the ECCA provides efficient simultaneous conditioning and/or decoupling on energy propagating across portions of the external energy pathways or planes.

The parallel arrangement of the common conductive electrodes within the layered architecture and the externally located conductive area provided by the conductive substrate also functions to cancel and/or suppress unwanted parasitics and electromagnetic emissions. Such emissions can radiate from or be received by portions of external differential energy pathways as energy propagates along the external energy pathways to an active load. Portions of the energy radiated from the external energy pathways that is trapped within the boundary formed by the layered architecture and the larger conductive area of the conductive substrate will be returned to its source. Some or all of any undesirable energy (signals, noise, and/or transients) conditioned and/or decoupled by the ECCA will be contained, suppressed and/or bypassed to the common conductive electrodes of the layered architecture and the larger conductive area provided by the conductive substrate. The foregoing functional description of the ECCA applies generally to all of the embodiments of the invention set forth hereinafter. Each subsequently described alternative embodiment is to be interpreted in light of the foregoing descriptions.

A more specific embodiment of the present invention illustrated in FIG. 2 is surface mount component carrier 10 for maintaining a ceramic planar surface mount electrical component, such as a differential and common mode filter as is disclosed in commonly owned U.S. Pat. No. 5,909,350 (Ser. No. 08/841,940); U.S. Pat. No. 6,097,581 (Ser. No. 09/008,769); and U.S. Pat. No. 6,018,448 (Ser. No. 09/056,379), incorporated herein by reference. Carrier 10 is a disk comprised of an insulator 14, such as ceramic, having at least two apertures 18. Insulator 14 is covered by a conductive metalized ground surface 16, at least two conductive pads 24 surrounding apertures 18, and insulating bands 22 surrounding each conductive pad 24. Throughout the written description "insulator" or "insulating material" may also be referred to as "planar insulator." Insulating bands 22 separate and electrically isolate conductive pads 24 from metalized ground surface 16. In the top plan view of carrier 10, shown in FIG. 3, the preferred embodiment of the invention is circular in shape with square insulating bands 22 surrounding partially rounded conductive pads 24. Carrier 10 and its various elements can be formed into many different shapes and Applicant does not intend to limit the scope of the invention to the particular shapes shown in the drawings.

Figure 11:
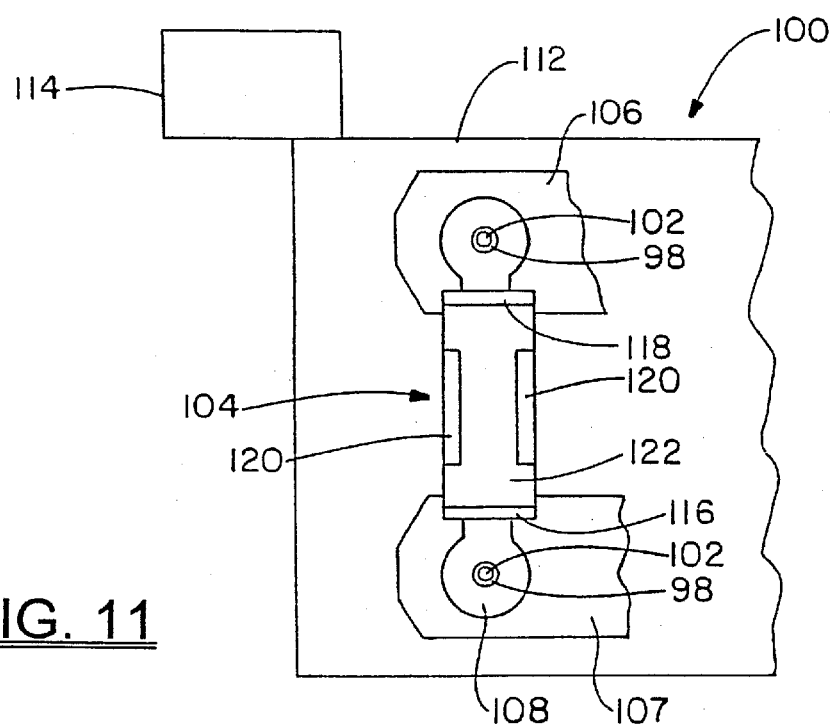
FIG. 11 is a partial top plan view of the connector surface mount differential and common mode carrier shown in FIG. 10.

Referring again to FIG. 2, in the preferred embodiment, metalized ground surface 16 covers a substantial portion of the top and sides of carrier 10. Through-hole plating 20 covers the inner walls of aperture 18 and electrically couples to the corresponding conductive pad 24. Through-hole plating 20 provides greater surface area for electrical coupling of conductors 34 to conductive pads 24 as the conductors 34 are disposed through apertures 18. The configuration of metalized ground surface 16, insulating bands 22 and conductive pads 24 provide the necessary contacts for connecting a surface mount component, such as differential and common mode filter 12, to the upper surface of carrier 10, which in turn provides electrical connection between conductors 34 and surface mount component 12. The surface mount components referred to, such as differential and common mode filter 12, are provided in standard surface mount packages which include a number of solder terminations for electrically coupling the device to external circuitry or in this case to carrier 10. Filter 12 includes first differential electrode band 28 and second differential electrode band 30 extending from either end of filter 12. Extending from the center of filter 12 is at least one and more typically two, common ground conductive bands 26. An insulated outer casing 32 electrically isolates first and second differential electrode bands 28 and 30 and common ground conductive bands 26 from one another. A top plan view of a standard surface mount device as just described is shown in FIG. 11 as differential and common mode filter 104. The filter 104 is comprised of first differential conductive band 116, second differential conductive band 118 and two common ground conductive bands 120. The insulated outer casing 122 separates and electrically isolates each of the various conductive bands from one another.

FIG. 2 shows filter 12 positioned upon the top surface of carrier 10 so that the common ground conductive bands 26 come in contact with the portion of the metalized ground surface 16 which separates both of the insulating bands 22 from one another. This is accomplished by positioning differential and common mode filter 12 lengthwise between the two conductive pads 24 such that first differential electrode band 28 is in contact with one of the two conductive pads 24 and second differential electrode band 30 comes in contact with the other conductive pad 24. Once filter 12 has been positioned, by default, insulated outer casing 32 of filter 12 aligns with portions of insulating bands 22 thereby maintaining electrical isolation between the various conductive and electrode bands of filter 12. First and second differential conductive bands 28 and 30 and the common ground conductive bands 26 comprise of solder terminations found in typical surface mount devices. Once filter 12 is positioned upon carrier 10 standard solder reflow methods are employed causing the solder terminations to reflow thereby electrically coupling and physically bonding filter 12 to carrier 10. Customary solder reflow methods which can be used include infrared radiation (IR), vapor phase and hot air ovens or any other means which can be used to expose the solder to sufficiently elevated temperatures. Once differential and common mode surface mount filter 12 is coupled to carrier 10, the combination of the two parts can be manipulated, either manually or through various types of automated equipment, without subjecting filter 12 to mechanical and physical stresses normally associated with the handling of miniature and delicate electronic components.

Once coupled to carrier 10, filter 12 is electrically connected to external circuitry through conductors 34 which may comprise of wire leads or lengths of flexible wire. Once disposed through apertures 18, conductors 34 are soldered to conductive pads 24 and within apertures 18. Thru-hole plating 20 allows solder applied to conductive pads 24 and conductors 34 to flow into apertures 18 thereby adhering to the thru-hole plating. Component carrier 10 reduces mechanical and physical stresses such as shock, vibration and various thermal conditions which filter 12 would otherwise be subjected to and provides a complete ground shield for filter 12. Because carrier 10 has a greater surface area then filter 12 and a substantial portion of that surface area is covered by metalized ground surface 16, carrier 10 acts as a ground shield which absorbs and dissipates electromagnetic interference and over voltages. These added benefits improve the overall functional performance and characteristics of filter 12.

FIGS. 4 and 5 illustrate a further alternate embodiment of the present invention, that being double-sided carrier 40. Carrier 40 is identical to carrier 10, as shown in FIG. 2, except that carrier 40 is double-sided and as a bottom surface which is substantially identical to the top surface. This configuration allows two differential and common mode surface mount filters 12a and 12b to be mounted to the upper and lower surfaces of carrier 40. As illustrated in FIG. 4, metalized ground surface 16 covers substantial portions of the top, sides and bottom of carrier 40 providing a greater overall surface area. The increased surface area of metalized ground surface 16 imparts greater shielding characteristics in carrier 40 which absorb and dissipate electromagnetic interference. In addition, both the top and bottom of carrier 40 include corresponding conductive pads 24 which are electrically connected to one another by thru-hole plating 20 which covers the inner walls of apertures 18.

Double-sided carrier 40 is also advantageous in that it allows for flexibility needed to meet electromagnetic interference (EMI) and surge protection requirements simultaneously through integration of different surface mount components on the same carrier substrate. As an example, a differential and common mode filter, as previously described, could be coupled to the top of carrier 40 while a MOV device could be coupled on the bottom of carrier 40 effectively placing the filter and MOV devices in parallel to provide EMI and surge protection in one compact, durable package. Because carrier 40 provides a rigid base for maintaining various electronic surface mount components, the components themselves are subjected to less physical stress during manufacturing processes which in turn increases yields and lowers manufacturing costs.

FIG. 5 shows a modified configuration of metalized ground surface 16, conductive pads 24 and insulating bands 22. In this alternative embodiment, insulating bands 22 have been substantially increased such that the surface area of carrier 40 is substantially covered by insulation as opposed to a metalized ground surface. This configuration can be used when decreased shield characteristics are desired or the particular interaction between carrier 40 and the surface mount component needs to be precisely controlled. One example is when parasitic capacitance values must be maintained below a certain level. Note that the particular shapes of insulating bands 22, shown in FIG. 5, are not necessary. All that is required is that the surface area covered by metalized ground surface 16 be varied which in turn varies the electrical characteristics of double-sided carrier 40. It should also be noted that the surface pattern shown in FIG. 3 can be used with the double-sided carrier 40, shown in FIG. 4, or the surface pattern shown in FIG. 5 could just as easily be used with carrier 10, shown in FIG. 2. To obtain further of control the electrical characteristics of double-sided carrier 40, one surface could be configured as shown in FIG. 5 while the other surface, either top or bottom, could be configured as shown in FIG. 3. Altering the upper and lower surface patterns of double-sided carrier 40 depending upon the types of surface mount components coupled to carrier 40 allows for obtaining optimal electrical characteristics as needed.

FIGS. 6 through 9 illustrate further alternate embodiments of the single and double-sided carriers shown in FIGS. 2 through 5. Referring to FIG. 6, single-sided carrier 50 is similar to carrier 10 of FIG. 2 except that carrier 50 includes a conductive core 38 imbedded within insulator 14 which is electrically coupled to metalized ground surface 16. As shown in FIGS. 6 and 7, conductive core 38 abuts and comes in contact with metalized ground surface 16 along the sides of carrier 50. A via 36 is disposed within the center of carrier 50 which provides an additional electrical connection between the metalized ground surface 16 which covers the top of carrier 50 and conductive core 38. Via 36 is a small aperture formed in the surface of carrier 50 which passes through insulator 14 and comes in contact with conductive core 38. Although not shown, via 36 includes thru-hole plating which electrically connects conductive core 38 and metalized ground surface 16. FIG. 7 shows the surface configuration for carrier 50 which is identical to that shown in FIG. 5 with the addition of via 36. As described earlier, the surface configuration of carrier 50 can vary. For example, the surface configuration could be similar to that shown in FIG. 3 with the addition of via 36 disposed within its center. The benefit to embedding conductive core 38 within insulator 14 and electrically connecting conductive core 38 to metalized ground surface 16 is that a greater surface area is provided for absorbing and dissipating electromagnetic interference and over voltages without an increase in the overall dimensions of carrier 50.

FIGS. 8 and 9 disclose a further alternate embodiment of the present invention in double-sided carrier 60. Carrier 60 is identical to carrier 50, shown in FIGS. 6 and 7, except that it is double-sided as the embodiment shown in FIG. 4 with the addition of via 36 disposed through the bottom of carrier 60 electrically coupling metalized ground surface 16 along the bottom of carrier 60 to conductive core 38. This embodiment provides a ground having an increased surface area to both surface mount differential and common mode filter components 12a and 12b coupled to the top and bottom of double-sided carrier 60.

Figure 10:
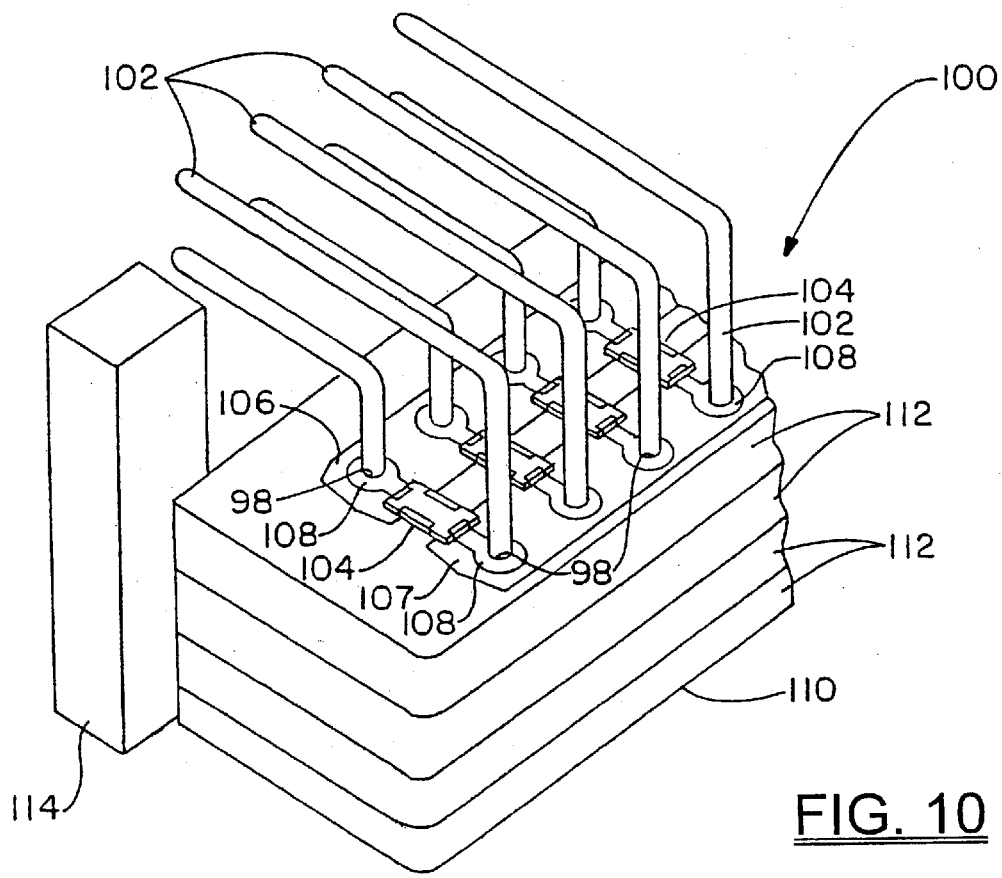
FIG. 10 is a partial perspective view of a further embodiment of a connector surface mount differential and common mode filter carrier of the present invention.

An additional embodiment of the present invention, connector carrier 100, is illustrated in FIG. 10. In this embodiment the surface mount component carrier is directly incorporated within an electronic connector. Connector carrier 100 is comprised of a metalized plastic base 112 having a plurality of apertures 98 disposed through base 112, each of which receives a connector pin 102. Although not shown, portions of each connector pin 102 extends through base 1 12 and out of the front 110 of connector carrier 100. The portions of pins 102 extending from the front 110 of carrier 100 form a male connector which is then, in turn, received by a female connector as is known in the art. The same configuration could be implemented on a female connector which then receives male pins. Coupled to both edges of connector carrier 100, although only one edge is shown, is mounting base 114 which elevates base 112 from a surface such as a printed circuit board. The particular embodiment of connector 100 shown in FIG. 10 is of a right angle connector in which the tips of pins 102 would be inserted within apertures in a printed circuit board. Pins 102 would then be soldered to the individual apertures or pads in the printed circuit board to provide electrical connection between pins 102 and any circuitry on the printed circuit board. To provide for the coupling of a plurality of differential and common mode filters 104 between the various connector pins 102, two insulating bands 106 and 107 are provided to electrically isolate each of the connector pins 102 from the metalized plastic base 112 which covers substantially all of the surface area of connector carrier 100.

Referring to FIG. 11, the relationship between insulating bands 106 and 107, metalized plastic base 112 and differential and common mode filter 104 will be explained in more detail. While only one example is shown, both insulating bands 106 and 107 include a plurality of conductive pads 108 which surround apertures 98. Conductive pads 108 are electrically coupled to connector pins 102 disposed through apertures 98. Insulating bands 106 and 107 provide a non-conductive barrier between the conductive pads 108 and the metalized plastic base 112. Surface mount components, such as differential and common mode filter 104, are positioned between insulated bands 106 and 107 so that first differential conductive band 116 of filter 104 comes in contact with a portion of a conductive pad 108 and second differential conductive band 118 comes in contact with a portion of an opposite conductive pad 108. Insulated outer casing 122 of filter 104 slightly overlaps onto each insulating band 106 and 107 and metalized plastic base 112 to maintain electrical isolation of first and second differential conductive bands 116 and 118 and metalized plastic base 112 of connector carrier 100. Because metalized plastic base 112 runs between insulating bands 106 and 107, common ground conductive bands 120 of filter 104 come in contact with the metalized plastic base 112. As described earlier, each of the various conductive bands of filter 104 are comprised of solder terminations which, when subjected to known solder reflow methods, physically and electrically couple to any metallic surfaces which they come in contact thereby permanently coupling the surface mount components, i.e. filter 104, to connector carrier 100. As in the previous embodiments, connector carrier 100 allows miniature, fragile surface mount components to be used without subjecting those components to increased physical stress which can cause damage to the components, lowering production yields and increasing overall production costs. Metalized plastic base 112 also provides a large conductive surface area connected to the ground terminations of filter 104 improving the ground shield used to absorb and dissipate electromagnetic interference and over voltages.

As described herein with relation to each of the differential and common mode filter carrier embodiments, the primary advantages are the additional physical strength the filter carriers provide to the differential and common mode filters and the increased shield and ground effects provided by the enlarged conductive surface areas coupled to the differential and common mode filters.

Figure 12A:
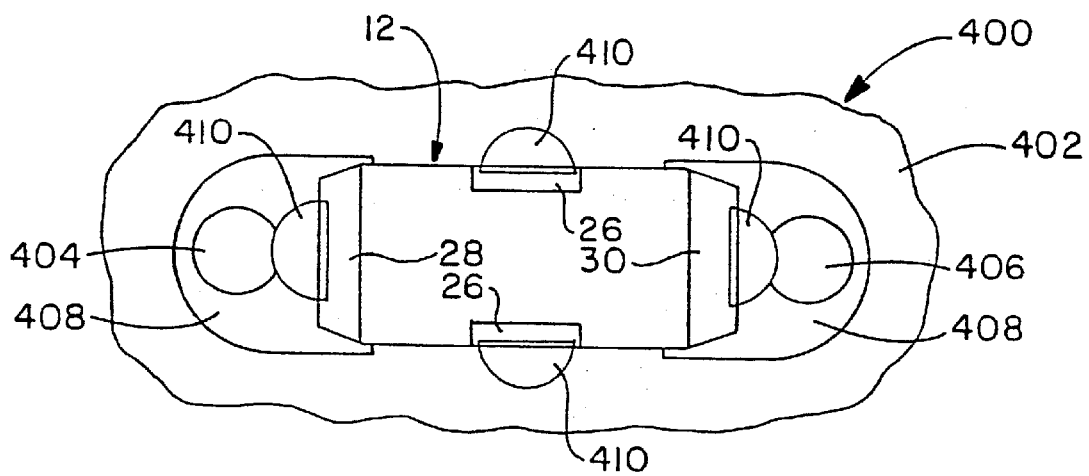
FIG. 12A is a top plan view of a carrier energy conditioning circuit assembly of the present invention.
Figure 12B:
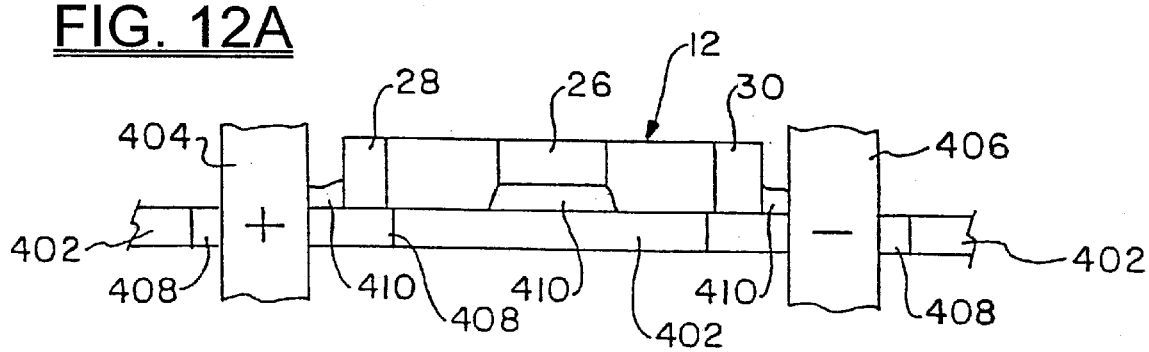
FIG. 12B is a side elevational view of the carrier energy conditioning circuit assembly shown in FIG. 12A.

FIGS. 12A and 12B show the carrier energy conditioning circuit assembly 400 which resulted from the combination of the previously described component carriers with the differential and common mode filter 12. Shown in FIG. 12A, differential and common mode filter 12 is placed upon conductive ground surface 402 making physical contact between conductive ground surface 402 and common ground conductive electrode bands 26. First and second differential conductive bands 30 and 28 are placed upon insulation pads 408 with differential signal conductors 404 and 406 disposed through each insulation pad 408. First differential electrode band 28 and first differential signal conductor 404 are then further coupled physically and electrically to each other through a well known means in the art such as solder 410. In addition, second differential electrode band 30 and second differential signal conductor 406 are coupled physically and electrically to one another and common ground conductive electrode bands 26 are coupled physically and electrically to ground area 402.

The internal construction of differential and common mode filter 12 electrically isolates differential signal conductor 404 and first differential electrode band 28 from second differential signal conductor 406 and second differential electrode band 30. The internal construction of the differential and common mode filter 12 creates a capacitive element coupled between the first and second differential signal conductors 404 and 406 and creates two capacitive elements, one coupled between the first differential signal conductor 404 and the common conductive ground surface 402 and the other coupled between the other second differential signal conductor 406 and the common conductive ground surface 402. While this arrangement of line-to-line and line-to-ground filtering is occurring the first and second differential signal conductors 404 and 406 remain electrically isolated from one another. From FIG. 12B it can be seen that first and second differential electrode bands 28 and 30 are prevented from coming into direct physical contact with conductive ground surface 402 due to insulating pads 408 interposed between differential signal conductors 404 and 406 and the conductive ground surface 402.

The combination of the differential and common mode filter 12 with its capacitive elements coupled line-to-line between differential signal conductors 404 and 406 and line-to-ground between the differential signal conductors 404 and 406 and conductive ground surface 402 provides substantial attenuation and filtering of differential and common mode electrical noise. At the same time the combination also performs simultaneous differential line decoupling. Another benefit provided by the combination include mutual cancellation of magnetic fields generated between differential signal conductors 404 and 406. By connecting the common ground conductive electrode bands 26 to a large conductive ground surface 402, increased shielding of the ground plane is provided to differential and common mode filter 12 which further enhances the desired functional characteristics of differential and common mode filter 12.

The combination of the differential and common mode filter 12 with the internal partial Faraday-like shields electrically connected to conductive ground surface 402 cause noise and coupling currents from different elements of carrier energy conditioning circuit assembly 400 to be contained at their source or to conductive ground surface 402 without affecting differential signal conductors 404 and 406 or other elements of carrier energy conditioning circuit assembly 400 when differential and common mode filter 12 is attached between differential signal conductors 404 and 406. Carrier energy conditioning circuit assembly 400 reduces, and in some cases eliminates, forms of capacitor parasitics and stray capacitance between differential signal conductors 404 and 406. Differential and common mode filter 12 provides these benefits due to its internal, partial Faraday-like shields that almost envelope the internal differential electrodes of differential and common mode filter 12 which connect to ground conductive electrode bands 26. These benefits are significantly increased when the partial Faraday-like shields are electrically connected by ground conductive electrode bands 26 to conductive ground surface 402.

Figure 13C:
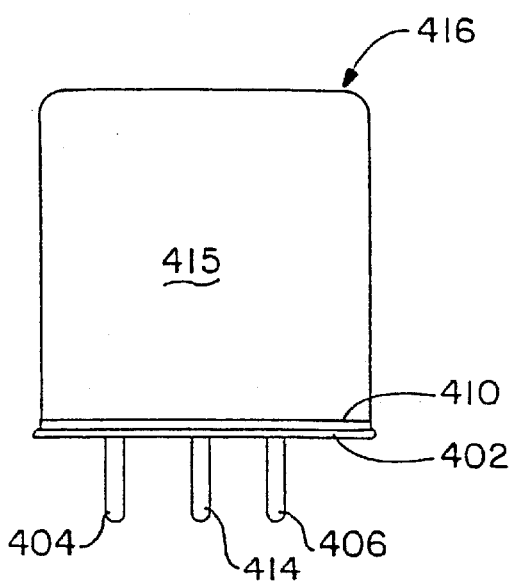
FIG. 13C is a front elevational view of the carrier energy conditioning circuit assembly enclosed in a crystal component application shown in FIG. 13B with a metal enclosure.
Figure 13D:
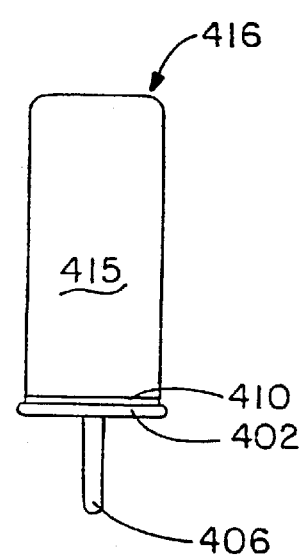
FIG. 13D is a side elevational view of the carrier energy conditioning circuit assembly enclosed in a crystal component application shown in FIG. 13C.
Figure 13A:
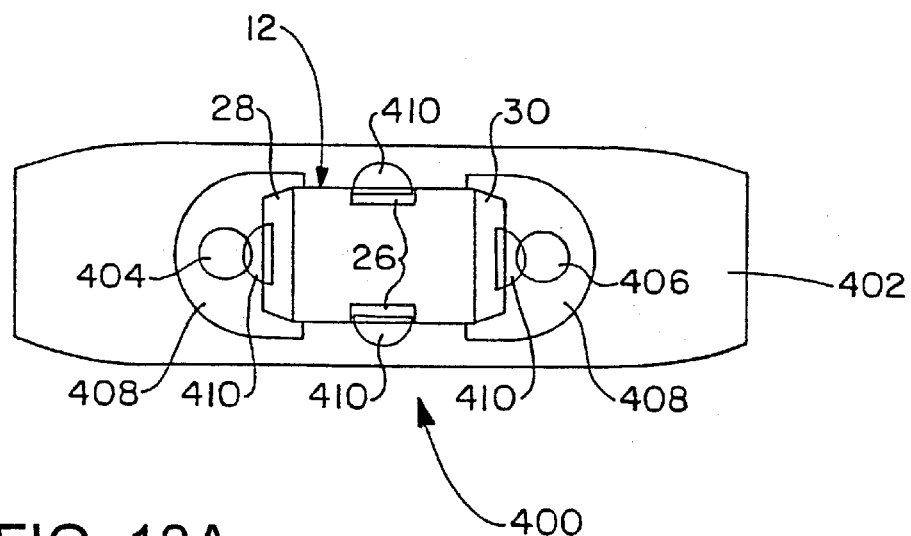
FIG. 13A is a top plan view of a carrier energy conditioning circuit assembly applied to a crystal base portion of a crystal component.
Figure 13B:
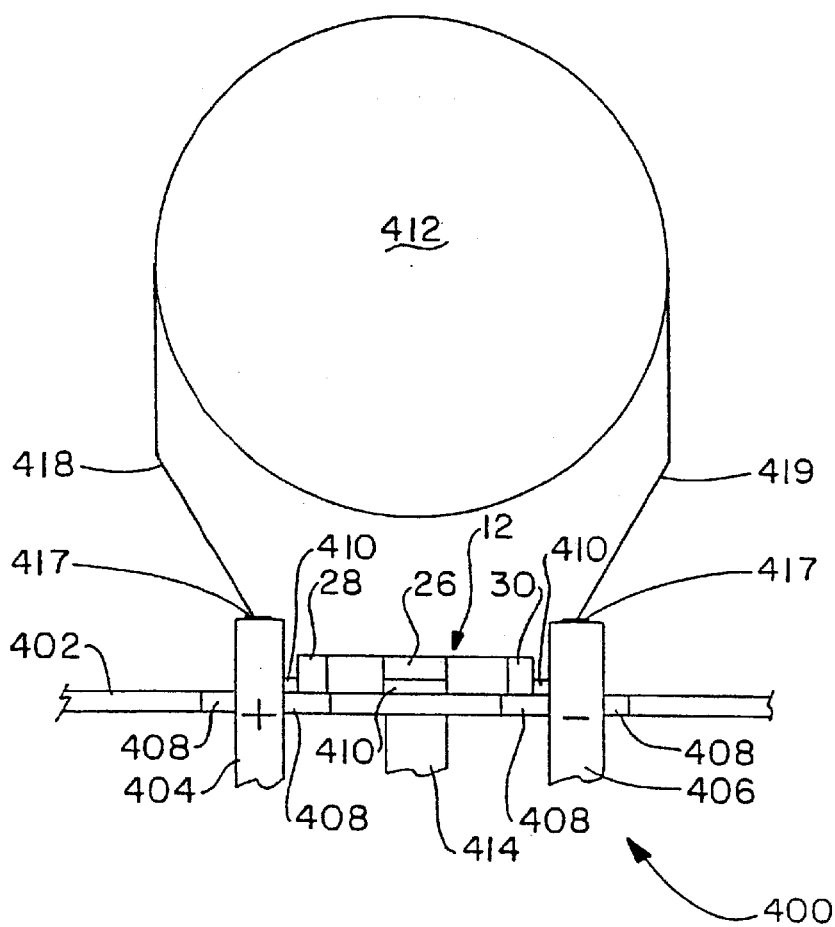
FIG. 13B is a side elevational view of the carrier energy conditioning circuit assembly applied to a crystal base portion of a crystal component shown in FIG. 13A.

FIGS. 13A–13D show one application of carrier energy conditioning circuit assembly 400 used in conjunction with a crystal. Referring to FIG. 13B, differential and common mode filter 12 is physically and electrically coupled between first and second differential signal conductors 404 and 406 and to ground conductive surface 402. In this particular application ground conductive surface 402 is comprised of the metal base of the crystal, which in turn is connected to a metal cover 415 shown in FIGS. 13C and 13D. First and second differential signal conductors 404 and 406 of carrier energy conditioning circuit assembly 400 are electrically isolated from ground conductive surface 402 by insulation pads 408. Common ground conductive electrode bands 26 are electrically connected to ground conductive surface 402 using solder 410 or other similar means. A ground conductor pin 414 is also attached or molded monolithically to conductive ground surface 402 by soldering, welding or casting. Ground conductor pin 414 allows for further connection of crystal component application 416 to a system ground (not shown). The internal construction of the differential and common mode filter 12 creates a capacitive element coupled between the first and second differential signal conductors 404 and 406 and creates two capacitive elements, one coupled between the first differential signal conductor 404 and ground conductive surface 402 and the other coupled between the other second differential signal conductor 406 and ground conductive surface 402. While this arrangement of line-to-line and line-to-ground filtering is occurring the first and second differential signal conductors 404 and 406 remain electrically isolated from one another. From FIG. 13B it can be seen that first and second differential electrode bands 28 and 30 are prevented from coming into direct physical contact with ground conductive surface 402 due to insulating pads 408 interposed between differential signal conductors 404 and 406 and the ground conductive surface 402.

FIGS. 13C and 13D show the final combination of crystal component assembly 416 and its metal housing 415 which provides an additional ground shield for the combination. The carrier energy conditioning circuit assembly 400 shown in crystal component assembly 416 simultaneously filters and attenuates common mode and differential mode electrical noise attributed to such circuitry including such noise found between differential electrical line conductors 404 and 406. Crystal component assembly 416 can also substantially reduce and in some cases eliminate or prevent differential current flow, mutual inductive coupling such as cross talk and ground bounce between either differential electrical line conductor 404 and 406 and the common voltage reference located on ground conductive surface 402. The carrier energy conditioning circuit assembly 400 also simultaneously provides mutual cancellation of opposing magnetic fields attributed to and existing between differential electrical line conductors 404 and 406. In addition, carrier energy conditioning circuit assembly 400 complements the inherent, internal ground structure and internal shield structures that nearly envelope or surround each opposing electrode within differential and common mode filter 12 to substantially improve overall noise attenuation on differential signal conductors 404 and 406 that would otherwise affect and degrade the desired performance of crystal component application 416. The essential elements of carrier energy conditioning circuit assembly 400 comprise of differential and common mode filter and decoupler 12 as defined herein with a capacitive element coupled between the first and second differential signal conductors 404 and 406 and two capacitive elements, one coupled between the first differential signal conductor 404 and ground conductive surface 402 and the other coupled between the other second differential signal conductor 406 and ground conductive surface 402 while maintaining electrical isolation between the first and second differential signal conductors 404 and 406; at least two energized differential electrical line conductors; and a physical and electrical coupling of common ground conductive electrode bands 26 of differential and common mode filter 12 to ground conductive surface 402. The various elements listed that make up carrier energy conditioning circuit assembly 400 are interconnected using solder 410, conductive epoxy 417 or other means well known in the art.

The carrier energy conditioning circuit assembly is created when a differential and common mode filter 130 or 130' of the type shown above or of variations incorporated by reference, is used in any application combination of the specific elements that can be assembled on, into or within an energized, electrical circuit system. The addition of the differential and common mode filter to the existing circuit creates a unique electrical circuit system. The electrical circuit system, including the differential and common mode filter, can be located on or in, but not limited to, a carrier, an interposer, a PCB, a connector, an IC package, a chip carrier, or a silicon die. The electrical circuit system comprises an energy source and load energized through a minimum of one or more phased or oppositely phased or charged line conductor elements to receive conditioning. These can comprise single or mixed elements, such as, but not limited to, traces, vias, wires, conductors, or any other element that can be electrically charged.

The invention comprises a differential and common mode filter and decoupler connected internally within an integrated circuit package or substrate in order to filter and protect the integrated circuit power bus. The invention functions without debilitating ground return EMI or parasitics returning back through the differential and common mode filter and decoupler, which would otherwise affect the integrated circuit. Other advantages are in the elimination of multiple external and/or internal decoupler capacitors that have been needed in the past. The prior art has required decoupling capacitors both on the outside and inside of the integrated circuit package or substrate.

The present invention consisting of the differential and common mode filter and decoupler internally connected to the power bus lines of an integrated circuit makes up a single unit that handles and/or conditions all energy sources required by the load demands of an integrated circuit through a single point of conditioning. The invention also provides a reference ground for all power and return lines, traces or conductors entering and leaving the integrated circuit package or substrate.

In embodiments of the present invention shown in FIGS. 14–20, various differential and common mode filters are used in combination with a carrier substrate of the type used in an integrated circuit package such as, but not limited to, a digital signal processor or microprocessor, to form a carrier energy conditioning circuit assembly. The substrate carrier is typically made of a conventional material such as, but not limited to, glass, ceramic, special thermoplastic, or any conventional material used in the electronics industry. The carrier may have one or more layers in which a power bus, a return bus, and a ground plane are configured. The ground plane is typically made of conventional trace material such as, but not limited to, gold, copper, conductive layering or doping, etc. The ground plane may either be floating or electrically connected to the system ground, chassis ground, etc. The combination of the layered architecture and carrier can dissipate and/or accept energy in a balanced manner from the circuit, acting as a central energy source or reservoir through multiple conductive pathways. When the differential and common mode filter attached to an external conductive area or ground, the external conductive area or ground areas are extended, effectively shielding and enveloping each differential electrode and the effectiveness of the overall conditioning functions are enhanced. The undesirable signals (noise) or transients can dissipate over a broader surface area of the extended conductive area or larger external ground plane. The differential and common mode filter can be attached to the carrier on top, on bottom, or imbedded within the carrier as discussed below.

Referring now to FIG. 14A, a top view of an integrated circuit 220 is shown. The center area of integrated circuit package 220 is typically covered with a glob sealant or a substrate cover as is commonly used in the electronics industry, to electrically insulate and protect the integrated circuit components. This top cover has been removed to reveal the interior of integrated circuit package 220, which comprises a novel substrate carrier 180 attached to a silicon die (not shown) of the integrated circuit that is mounted in a lead frame 221. Carrier substrate 180 has a power bus trace 182, a return bus trace 184, and a ground plane 186 all attached in a single layer to a top surface of the carrier 180. Bus traces 182 and 184 are shown in a concentric pattern on the top surface of the carrier 180. The concentricity of the bus traces 182 and 184 provide a cancellation of inductance due to the opposite current flow through the bus traces. Bus traces 182 and 184 are shown in a concentric octagonal pattern. While the present invention is not limited to a particular shape, it is recognized that concentric bus traces having 45 degree traces result in a reduction of noise reflections and ground bounce when compared to concentric traces having 90 degree trace turns, such as in a square or rectangular configuration. In the same manner, concentric circular or elliptical bus traces will result in a greater reduction of noise reflections and ground bounce than concentric traces having 45 degree trace turns.

Still referring to FIG. 14A, a plurality of loads 188 are connected to traces 182 and 184 by bond wires 190, jumper wires, or other conventional interconnects used in the electronics industry. The bond wire 190 lengths are kept as short as possible to reduce stray inductance. Loads 188 are representative of internal loads of the integrated circuit 220 and comprise the various functions and devices supported by the integrated circuit. Loads 188 are typically connected by bond wires 190 to leads 223, which surround the perimeter of the integrated circuit 220. The loads 188 are symbols which are shown on the top surface of the lead frame for communication convenience.

Ground plane 186 comprises three regions; a ground trace 222 that is concentric with and in between bus traces 182 and 184, an outer ground area 224 that surrounds the outermost bus trace 184, and an inner ground area 226 that is surrounded by the innermost bus trace 182. Ground trace 222 separates and provides some inductive cancellation, cross talk suppression, and line to line isolation of the bus traces 182 and 184. The conductive surfaces of the bus traces 182,184 are electrically separated from ground plane 186 by open areas on the surface of substrate carrier 180, which are generally concentric with the bus traces 182,184.

To allow for insertion of a differential and common mode filter 200, each of bus traces 182 and 184 have a predetermined space of physical separation between them. The integrated circuit package is designed such that multiple power entry points are reduced to one pair of power entry pins 82 and 83 which are connected to the traces 182, 184 by bond wires 190 or other conventional interconnects. Differential and common mode filter 200 is located in a predetermined position as close as possible to power entry pins 82 and 83 which also corresponds to the predetermined space of physical separation between traces 182 and 184. The single power entry portal represented by pins 82 and 83 and the proximity of the filter 200 to the power entry portal reduces the noise that can enter or exit the integrated circuit and interfere with circuitry both internal or external to the integrated circuit package.

Ground areas 222, 224, and 226 are interconnected by a single point ground area 228 (see FIG. 14B) which is located directly beneath the differential and common mode filter 200. The ground layer 186 of the carrier substrate 180 in combination with the positioning of the filter 200 in proximity to the power entry pins 82, 83 results in isolation of noise generated by the integrated circuit package 220 from the external circuitry such as, but not limited to, a printed circuit board.

Differential and common mode filter 200 comprises first differential electrode bands 202, second differential electrode bands 206, and common ground conductive bands 204, all separated from each other by insulated outer casing 208. The filter 200 is oriented on the carrier 180 such that the first differential electrode bands 202 and the second differential electrode bands 206 can be attached to the ends of the traces 182 and 184 to connect the individual traces and complete the circuit path. Continuity of traces 182 and 184 reduces reflections and ESL. Common ground conductive bands 204 are electrically connected to the ground plane 186 through single point ground area 228 shown in FIG. 14B. The connection of the common ground conductive bands 204 and the differential electrode bands 202 and 206 can be accomplished using industry standard means such as solder, springs, etc., as previously discussed herein. The alignment of filter 200 in parallel with the loads and the arrangement of the single layer carrier substrate 180 results in improved decoupling performance.

Figure 15:
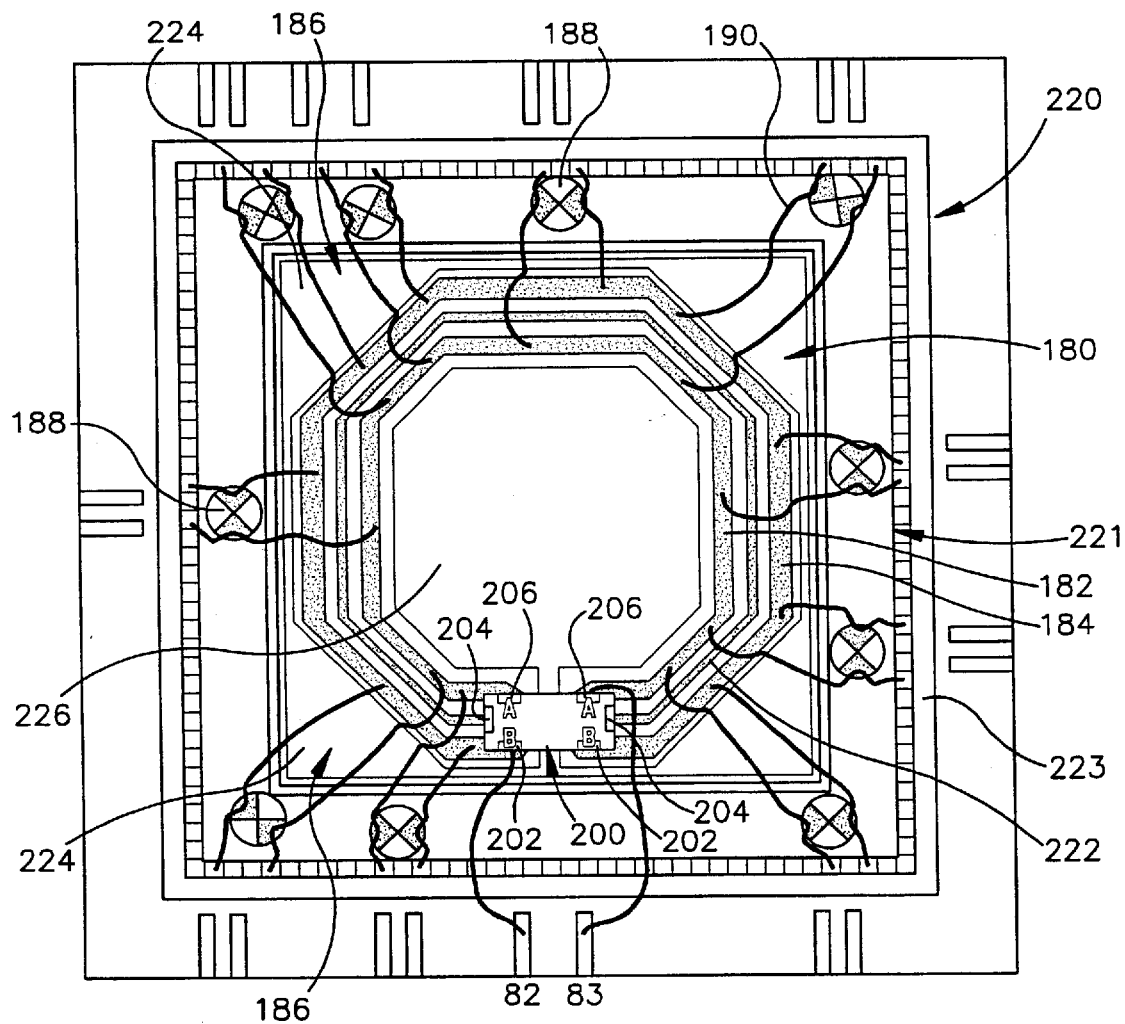
FIG. 15 is a top plan view of a carrier energy conditioning circuit assembly comprising a differential and common mode filter mounted transversely on a single layer substrate carrier within an integrated circuit package.

Referring now to FIG. 15, generally the same top view of an integrated circuit 220 is shown, except that the orientation of filter 200B is rotated 90 degrees. This rotation requires minor modifications related to the mounting of the filter 200B, and the location of differential electrode bands 202 and 206. The differential electrode bands 202 and 206 are now on the same longitudinal side of the filter 200B, respectively, instead of opposite sides as shown in FIG. 14A. The common ground conductive bands 204 are attached to a single point ground area (not shown) underneath the filter 200B which connects the ground areas 222, 224, and 226 to form ground plane 186 in a similar manner as described for the previous embodiment.

Although not shown or depicted in FIGS. 14A and 15, it is noted that carriers 180, 280 should be at least the size of the integrated circuit 220 it is covering so as not to allow sneak currents to couple back on the floating image reference (not shown)—created by the energized energy conditioning circuit assembly.

The power bus 182, return bus 184 and ground plane 186 can be imbedded in the carrier substrate on different levels. Referring now to FIG. 16A, a top plan view of a carrier substrate 280 is shown having a power bus trace 182 and a return bus trace 184 attached to a top surface thereof. A ground plane 186 is attached to a bottom surface of the carrier 280 as shown in a front cross-sectional view in FIG. 16B and side cross-sectional view FIG. 16C. A plurality of loads 188 are connected to traces 182 and 184 by bond wires 190, or other conventional interconnects used in the electronics industry. The loads 188 are internal microprocessor (not shown) and/or integrated circuit (not shown) loads representing the various functions and devices (not shown) supported by the microprocessor (not shown) and/or integrated circuits (not shown), and are typically connected (not shown) thereto by bond wires attached to leads, which surround the perimeter of the integrated circuit (not shown). The loads 188 are shown as symbols on the top surface of the carrier for ease of understanding. The traces 182 and 184 are shown in a concentric pattern on the top surface of the carrier 280. The concentricity of the traces 182 and 184 provide a cancellation of inductance due to the opposite current flow through the bus traces, as previously discussed.

As in the previous embodiment FIG. 14, differential and common mode filter 200 is located in a predetermined position on substrate carrier 280 as close as possible to power entry pins 82 and 83 and at a predetermined space of physical separation between each of the traces 182 and 184. The single power entry portal represented by pins 82 and 83 and the proximity of the filter 200 to the power entry portal reduces the amount of noise that can enter or exit the integrated circuit and interfere with the circuitry, both internal and external to the integrated circuit package.

Differential and common mode filter 200 is oriented on the carrier 280 such that the first differential electrode bands 202 and the second differential electrode bands 206 can be attached to the ends of the traces 182 and 184 to connect the individual traces and complete the circuit path. The common ground conductive bands 204 are electrically connected to the ground plane 186 by vias 192 as shown in FIGS. 16B and 16C. Via 192 is a small aperture formed in the surface of carrier 280, which is disposed through the body of carrier 280 to provide an electrical connection to ground plane 186 on the bottom surface of carrier 280. Although not shown, via 192 includes thru-hole plating to provide the electrical connection. The connection of the common ground conductive bands 204 and the differential electrode bands 202 and 206 can be accomplished using industry standard means such as solder, springs, etc., as previously discussed above.

In another embodiment of the invention shown in FIG. 16D, carrier 280 also includes an insulation layer 194 attached underneath ground plane 186. Insulation layer 194 can be made of any predetermined insulating material, such as that of the carrier 280, or of a non-conductive epoxy. The insulation layer 194 prevents electrical connection to the silicon die when the carrier 280 is assembled onto other components within an integrated circuit package (not shown).

In another embodiment of the invention, bus traces 182 and 184 are on different layers of the substrate carrier 380. Referring now to FIG. 17A, a top plan view of carrier substrate 380 is shown having power bus trace 182 attached to a top surface thereof. A return bus trace 184 is shown embedded within the carrier substrate 380 at a second layer, as best shown in FIGS. 17B and 17C. A ground plane 186 is shown embedded within the carrier substrate 380 at a third layer below the second layer. An insulation layer 194 is optionally attached to a bottom surface of the carrier 380. Returning now to FIG. 17A, a plurality of loads 188 are connected to power bus trace 182 by bond wires 190. The loads 188 are also connected by bond wires 190 to vias 196 which provide an electrical connection to the imbedded return bus trace 184 on the second layer as shown in FIGS. 17B and 17C. Since the bus traces 182 and 184 are on different layers, the traces are aligned directly over top of each other to provide enhanced cancellation of inductance due to the opposite current flow through the bus traces 182 and 184, which are the same size, shape, and length.

Referring back to FIG. 17A, filter 200 is attached to the top surface of the carrier 380 in the same manner as described in relation to FIG. 16A except that the second differential electrode bands 206 are connected to return bus 184 by vias 196. Although not shown, the vias 196 are offset from the return bus 184. The vias 196 are electrically connected to return bus 184 by electrical extension connectors (not shown) positioned between the return bus 184 and via 196. The offset allows the busses 182 and 184 to directly lie over top of each other on different levels without having the via 196 of the return bus 184 coming straight up through the carrier 380 and into the power bus 182. Additionally, power entry pin 82 is also electrically connected to return bus 184 through a bond wire 190 connected to a via 196 that extends down through the carrier to return bus 184.

Referring now to FIGS. 17B and 17C, insulation layer 194 is attached on the bottom surface of carrier 380 to prevent electrical connection to the silicon die when the carrier 380 is assembled onto other components within the integrated circuit package (not shown). FIG. 17D shows a cross-sectional view similar to FIG. 17B that also shows potting layer 187 over the top surface of carrier 380.

In a further embodiment shown in FIG. 18, filter 200 is embedded on a second layer within the substrate carrier 480. First and second differential electrode bands 202 and 206 of filter 200 are connected to power bus 182 on a first layer (on the top surface of the carrier 480) and return bus 184 on a fourth layer, respectively, by vias 196 extending through carrier 480. Common ground conductive band 204 of filter 200 is connected to the ground plane layer 186 by vias 192. Loads 188, although not shown, are connected to the power bus 182 by bond wires 190 in the same manner as in previous embodiments. In this embodiment, the ground plane 186 is between the power bus trace 182 and the return bus trace 184. Vias 196 from the filter 200 and the loads 188 must extend through apertures in the ground plane 186 to electrically connect to the return bus trace 184. The vias 196 are electrically insulated from the ground plane 186 by insulating band 208 surrounding the interior surface of the apertures of the ground plane 186. Ground separation obtained by positioning of the ground plane 186 between the power bus 182 and the return bus 184 results in improved suppression of cross talk and other parasitic effects. As in previous embodiments, bus traces 182 and 184 are on different layers and are aligned directly over top of each other to provide enhanced cancellation of inductance due to the opposite current flow through the bus traces which are the same size, shape, and length.

The differential and common mode filter has been presented in many variations both above and in commonly owned patents and patent applications, previously incorporated herein by reference. A further embodiment of the present invention utilizes a variation of the filter previously discussed. Shielded twisted pair feed through differential and common mode filter 300 is shown in FIG. 19A. The difference between this filter 300 and earlier presented filters is the location of first differential electrode bands 302A, 302B and second differential electrode bands 306A, 306B, which are located diagonally from each other, respectively. Common ground conductive bands 304 are separated from first and second differential electrode bands 302 and 306 by insulating material 308 as in the previous filter embodiments. Shielded twisted pair feed through differential and common mode filter 300 comprises a minimum of a first and second differential electrode plate 312 and 316, respectively, and a minimum of three common ground conductive plates 314 as shown in FIG. 19B. The plates 312, 314, and 316 are stacked and insulated from each other by material 308 as in the previous filter embodiments.

Figure 19D:
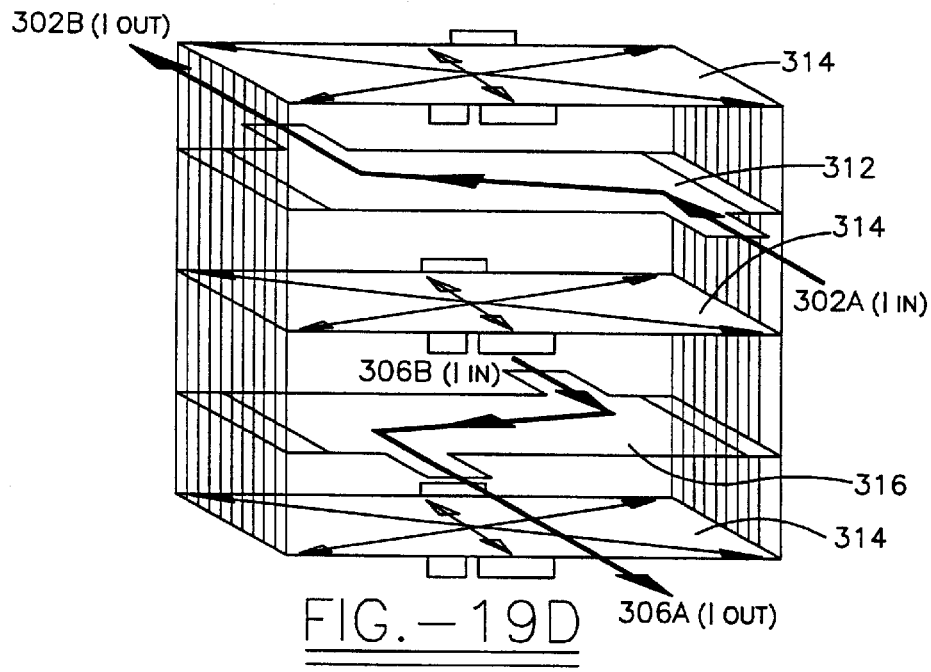

Referring now to FIGS. 19C and 19D, which show schematic representations of shielded twisted pair feed through differential and common mode filter 300 and how it is used to eliminate differential noise. Current I is shown flowing in opposing directions through first and second differential electrode bands 302A and 306B, crossing over each other, and flowing out through first and second differential electrode bands 302B and 306A.

In FIG. 19D, the filter 300 is depicted as coplanar plates 312, 314, and 316, with electrode plates 312, 316, each sandwiched by common ground conductive plates 314 in a Faraday cage configuration. The current I is shown flowing in opposite directions through the differential electrode plates. Note that the common ground conductive plates 314 are electrically interconnected, but insulated from the differential electrodes as has been disclosed in filter embodiments previously incorporated by reference herein.

Figure 19E:
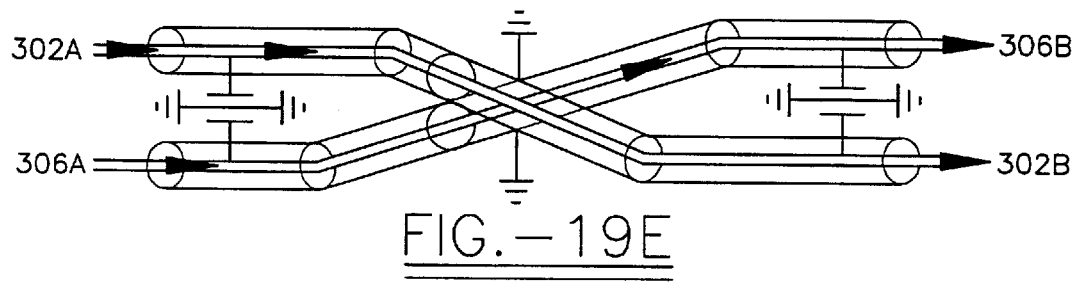
FIG. 19E and FIG. 19F are schematic representations of a shielded twisted pair feed through differential and common mode filter showing common mode noise cancellation.
Figure 19F:
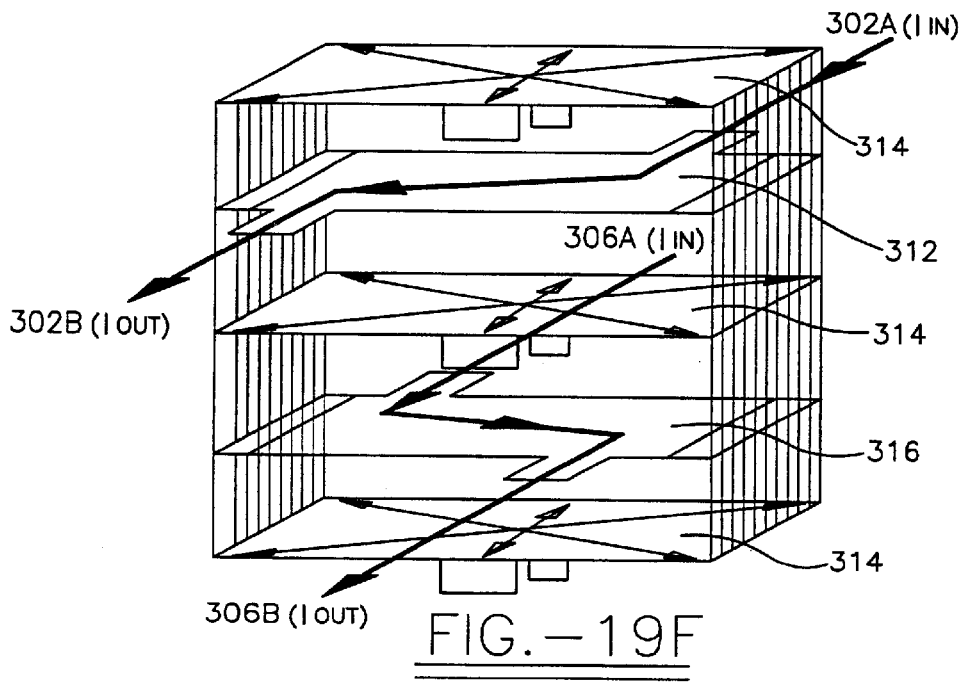

Referring now to FIGS. 19E and 19F, which show schematic representations of shielded twisted pair feed through differential and common mode filter 300 and how it is used to eliminate common mode noise. Current I is shown flowing in the same directions through first and second differential electrode bands 302A and 306A, crossing over each other, and flowing out through first and second differential electrode bands 302B and 306B.

In FIG. 19F, the filter 300 is again depicted as coplanar plates 312, 314, and 316, with electrode plates 312, 316, each sandwiched by common ground conductive plates 314 in a Faraday cage configuration. The current I is shown flowing in the same direction through the differential electrode plates. Note that the common ground conductive plates 314 are electrically interconnected, but insulated from the differential electrodes as has been disclosed in filter embodiments previously incorporated by reference herein.

Figure 20A:
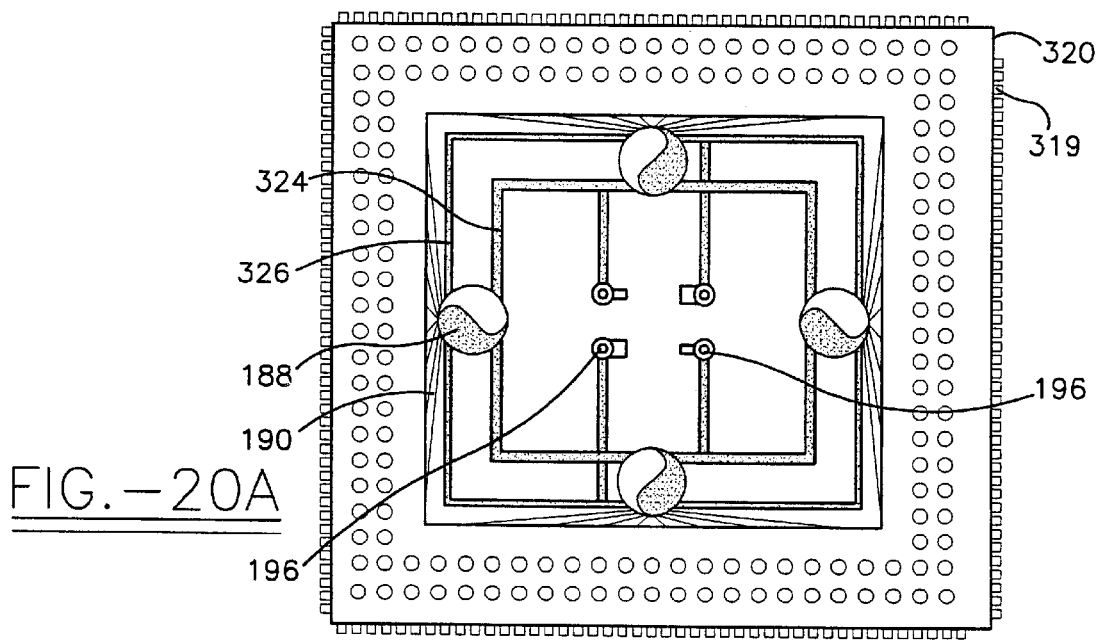
FIG. 20A is a top plan view of a carrier energy conditioning circuit assembly comprising a shielded twisted pair feed through differential and common mode filter embedded in a multi-layer substrate carrier within an integrated circuit package.
Figure 20B:
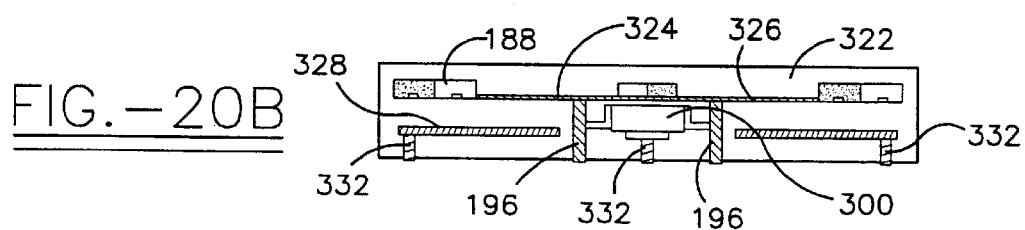
FIG. 20B is a front cross-sectional view of the integrated circuit package of FIG. 20A.
Figure 20C:
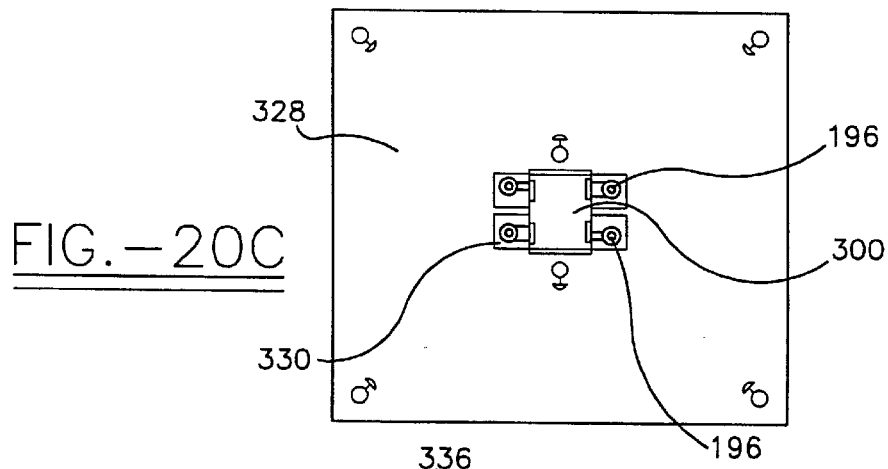
FIG. 20C is a top plan view of the ground plane layer of the integrated circuit package of FIG. 20A.

Referring now to FIGS. 20A, 20B, and 20C, the shielded twisted pair feed through differential and common mode filter 300 is shown embedded within an integrated circuit package 320. FIG. 20A shows a top plan view of an integrated circuit package 320 with a top insulating layer 322 removed to reveal power bus trace 324 and return bus trace 326 servicing internal loads 188 through bond wires 190 which are connected to leads 319 surrounding the perimeter of the integrated circuit package 320. The bus traces 324, 326 are shown as concentric squares which provide a cancellation of inductance due to the opposite current flow through the bus traces. Note that the traces 324, 326 are connected to vias 196 at the center of the integrated circuit package 320 in a manner that the connecting via 196 to each respective trace 324, 326 are positioned diagonally from each other for connection to shielded twisted pair feed through differential and common mode filter 300.

Turning now to FIG. 20B, a cross-sectional view shows shielded twisted pair feed through differential and common mode filter 300 embedded within the integrated circuit package 320 and positioned on ground plane 328 at a second level and connected to the bus traces by vias 196 which extend vertically down from the bus trace level, through ground plane 328 to the bottom surface of the integrated circuit package 320. At the ground plane 328 level, the vias 196 are electrically insulated from the ground plane by insulation 330 as best shown in FIG. 20C. As with the previous embodiments, the integrated circuit package is designed such that multiple power entry points are reduced to one pair of power entry pins (not shown). The shielded twisted pair feed through differential and common mode filter 300 is located in a predetermined position as close as possible to the power entry pins (not shown), which also corresponds to the predetermined space of physical separation between traces 324 and 326, which, in this example, is shown at the center of the integrated circuit package 320, although it is not limited to a particular location. The single power entry portal and the proximity of shielded twisted pair feed through differential and common mode filter 300 to the power entry portal reduces the amount of noise that can enter or exit the integrated circuit package 320 and interfere with the remaining circuitry, both internal or external to the integrated circuit package.

The ground plane is also shown with vias 332 extending downward from the ground plane 328 to the bottom surface of the integrated circuit package 320. The vias 332 enable the ground plane 328 to be connected to external ground (not shown) if needed for a particular application. Vias 196 and vias 332 are connected by wire bonds or other conventional interconnects (not shown) to their respective external connections.

Figure 21:
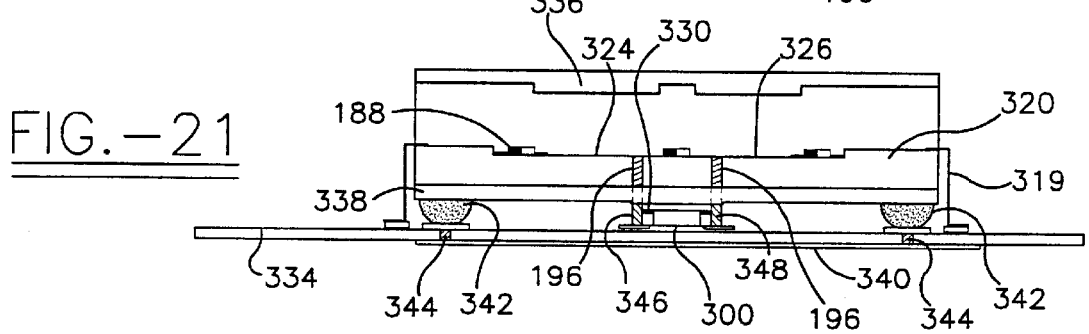
FIG. 21 is a top plan view of a carrier energy conditioning circuit assembly comprising a shielded twisted pair feed through differential and common mode filter mounted underneath a multi-layer substrate carrier within an integrated circuit package.

Another related embodiment is shown in a cross-sectional view in FIG. 21. The main difference between this embodiment and the embodiment shown in FIGS. 20A–20C is that shielded twisted pair feed through differential and common mode filter 300 is attached to the bottom of integrated circuit package 320 mounted on a printed circuit board 334. Substrate cover 336 is shown displaced from the integrated circuit package 320 to reveal internal loads 188. The bottom of the integrated circuit includes a ground substrate layer 338, which is electrically connected to ground plane 340 on printed circuit board 334 through ball grids 342 or other conventional interconnects and vias 344 extending through printed circuit board 334. Common ground conductive bands (not shown) of shielded twisted pair feed through differential and common mode filter 300 are attached to ground substrate layer 338 by solder or other conventional means. Bus traces 324, 326 are connected to differential electrode bands (not shown) of shielded twisted pair feed through differential and common mode filter 300 by vias 196. Although not completely shown, both the vias 196 and the differential electrode band attachments are electrically insulated from ground substrate layer 338 by insulation 330. Interconnects 346 and 348 extend downward from vias 196 and are connected to a single power entry portal (not shown) serving the integrated circuit package 320.

It should also be evident that using the differential and common mode filters, as compared to the labor intensive aspects of combining discrete components found in the prior art, provides an easy and cost effective method of manufacturing. Because connections only need to be made to either end of electrical conductors to provide a differential mode coupling capacitor and two common mode decoupling capacitors, time and space are saved.

As can be seen, many different applications of the differential and common mode filter architecture are possible and review of several features universal to all the embodiments must be noted. First, the material having predetermined electrical properties may be one of a number in any of the embodiments including but not limited to dielectric material, metal oxide varistor material, ferrite material and other more exotic substances such as Mylar film or sintered polycrystalline. No matter which material is used, the combination of common ground plates and electrode plates creates a plurality of capacitors to form a line-to-line differential coupling capacitor between and two line-to-ground decoupling capacitors from a pair of electrical conductors. The material having electrical properties will vary the capacitance values and/or add additional features such as over-voltage and surge protection or increased inductance, resistance, or a combination of all the above.

Second, in all embodiments whether shown or not, the number of plates, both common conductive and electrode, can be multiplied to create a number of capacitive elements in parallel which thereby add to create increased capacitance values.

Third, additional common ground conductive plates surrounding the combination of a center conductive plate and a plurality of conductive electrodes may be employed to provide an increased inherent ground and surge dissipation area and a Faraday cage-like structure in all embodiments. Additional common ground conductive plates can be employed with any of the embodiments shown and is fully contemplated by Applicant.

Fourth, the differential and common mode filter structure has the ability to balance its own electrical characteristics and to effect a cancellation of internal inductance attributed to it's structure thus preventing performance disruption of the electrical circuit system line conductors.

Fifth, the portability of the differential and common mode filter allows insertion into sub-electrical systems that mate with main electrical circuit system such as, but not limited to, integrated circuit carriers, integrated chip modules, system interposers, connector embodiments or any other sub-electrical systems that are subsequently mated to larger or more sophisticated electrical circuit systems.

Finally, from a review of the numerous embodiments it should be apparent that the shape, thickness or size may be varied depending on the electrical characteristics desired or upon the application in which the differential and common mode filter is to be used due to the physical architecture derived from the arrangement of common ground and electrode plates.

Although the principles, preferred embodiments and preferred operation of the present invention have been described in detail herein, this is not to be construed as being limited to the particular illustrative forms disclosed. They will thus become apparent to those skilled in the art that various modifications of the preferred embodiments herein can be made without departing from the spirit or scope of the invention as defined by the appended claims.

What is claimed is:

1. An energy conditioning arrangement comprising:
   a circuit having at least a source of energy and an energy-utilizing load;
   a substrate including;
      a first pathway operable as an energy source path from the source of energy of the circuit to the energy-utilizing load of the circuit;
   a second pathway operable as an energy return path from the energy-utilizing load of the circuit to the source of energy of the circuit;
      a conductive area isolated from the first and the second pathway; and
   an electrode arrangement having at least a first, a second, a third, a fourth, a fifth and a sixth electrode band;
      wherein the first and the third electrode band are conductively isolated from the second and the fourth electrode band;
      wherein the first, the third, the second, and the fourth electrode band are conductively isolated from the fifth and the sixth electrode band; and
   wherein the first pathway is conductively coupled to the first and the third electrode band, the second pathway is conductively coupled to the second and the fourth electrode band, and the conductive area is conductively coupled to the fifth and the sixth electrode band; and
   wherein the first and the second pathway are isolated from one another.

2. The energy conditioning arrangement as in claim 1, in which the electrode arrangement further comprises;
   a plurality of shielding electrodes including at least a first, a second, and a third shielding electrode that are conductively coupled to one another;
   a first electrode and a second electrode;
   the plurality of shielding electrodes, the first electrode, and the second electrode are spaced apart from one another by a material;
   the first and the second electrode are interspersed within the plurality of shielding electrodes;
      wherein the first electrode is positioned between the first shielding electrode and the second shielding electrode; and
      wherein the second electrode is positioned between the second shielding electrode and the third shielding electrode; and
   wherein the first electrode is coupled to the first and the third electrode band, and wherein the second electrode is coupled to the second and the fourth electrode band, and wherein the plurality of shielding electrodes are coupled to the fifth and the sixth electrode band.

3. The energy conditioning arrangement as in claim 2, wherein the material is comprised of any one or more materials selected from a group of materials consisting of a ferrite material, a dielectric material or a varistor material.

4. The energy conditioning arrangement as in claim 1, in which the electrode arrangement further comprises;
   a plurality of shielding electrodes including at least a first, a second, and a third shielding electrode that are conductively coupled to one another;
   a first electrode and a second electrode;
   the plurality of shielding electrodes, the first electrode, and the second electrode are spaced apart from one another by a material;
   the first and the second electrode are interspersed within the plurality of shielding electrodes;
   wherein the first electrode is positioned between the first shielding electrode and the second shielding electrode; and
   a seventh and an eighth electrode band;
   wherein the first, the third, the second, and the fourth electrode band are conductively isolated from the seventh and the eighth electrode band and the conductive area is coupled to the seventh and the eighth electrode band; and
   wherein the first electrode is coupled to the first and the third electrode band, and
   wherein the second electrode is coupled to the second and the fourth electrode band, and wherein the plurality of shielding electrodes are coupled to the fifth, the sixth, the seventh, and the eighth electrode band.

5. The energy conditioning arrangement as in claim 1, wherein the electrode arrangement further comprises;
   a plurality of shielding electrodes of substantially the same size and shape including at least a first, a second, and a third shielding electrode;
      wherein the plurality of shielding electrodes are conductively coupled;
   a first and a second electrode of substantially the same size and shape;
   the plurality of shielding electrodes and the first and the second electrode are spaced apart from one another by a material;
   the first and the second electrode are interspersed within the plurality of shielding electrodes;
   wherein the first electrode is positioned between the first and the second shielding electrode;
   wherein the second electrode is positioned between the second and the third shielding electrode; and a seventh and an eighth electrode band, wherein the first, the third, the second, and the fourth electrode band are conductively isolated from the seventh and the eighth electrode band and the conductive area is coupled to the seventh and the eighth electrode band; and wherein the first electrode is coupled to the first and the third electrode band, and wherein the second electrode is coupled to the second and the fourth electrode band, and wherein the plurality of shielding electrodes are coupled to the fifth, the sixth, the seventh, and the eighth electrode band.

6. The energy conditioning arrangement of claim 1, wherein the substrate comprises a plurality of layers;

wherein the first and the second pathway are coupled thereon a first layer of the plurality of layers of the substrate; and wherein the conductive area is coupled thereon a second layer of the plurality of layers of the substrate.

7. The energy conditioning arrangement of claim 1, wherein the substrate comprises a plurality of layers;

the first pathway is coupled thereon a first layer of the plurality of layers of the substrate;

the second pathway is coupled thereon a second layer of the plurality of layers of the substrate; and wherein the conductive area is coupled thereon a third layer of the plurality of layers of the substrate.

8. The energy conditioning arrangement as in claim 1, in which the circuit is energized.

9. The energy conditioning arrangement as in claim 1, in which the substrate is a printed circuit board.

10. The energy conditioning arrangement as in claim 1, in which the substrate is a connector.

11. The energy conditioning arrangement as in claim 1, in which the substrate is part of an integrated circuit package.

12. The energy conditioning arrangement as in claim 1, in which the first pathway is contiguous from the energy source to the third electrode band; and wherein the first pathway is contiguous from the first electrode band to the energy-utilizing load; and wherein the first pathway would be non-operable as a contiguous energy pathway from the energy source to the energy-utilizing load without selective coupling of portions of the electrode arrangement to the first pathway.

13. The energy conditioning arrangement as in claim 1, in which the first pathway is non-contiguous from the energy source to the energy-utilizing load without selective coupling of portions of the electrode arrangement to the first pathway; and wherein the second pathway is non-contiguous from the energy-utilizing load to the energy source without selective coupling of portions of the electrode arrangement to the second pathway.

14. The energy conditioning arrangement as in claim 1, wherein the first electrode band is positioned directly opposite the third electrode band with respect to the electrode arrangement; and wherein the second electrode band is positioned directly opposite the fourth electrode band with respect to the electrode arrangement.

15. The energy conditioning arrangement as in claim 1, wherein the first electrode band is positioned diagonally to the third electrode band with respect to the electrode arrangement; and wherein the second electrode band is positioned diagonally to the fourth electrode band with respect to the electrode arrangement.

16. The energy conditioning arrangement as in claim 1, in which the electrode arrangement is arranged within the plurality of layers of the substrate.

17. An circuit arrangement comprising:

a source of energy and an energy-utilizing load;

a first pathway operable as an energy source path from the source of energy of the circuit to the energy-utilizing load of the circuit;

a second pathway operable as an energy return path from the energy-utilizing load of the circuit to the source of energy of the circuit;

a conductive area that is conductively isolated from the first and the second pathway; and an electrode arrangement including;

a plurality of shielding electrodes having at least a first, a second, and a third shielding electrode that are conductively coupled to one another;

a first electrode and a second electrode;

the plurality of shielding electrodes, the first electrode, and the second electrode are spaced apart from one another by a material;

the first and the second electrode are interspersed within the plurality of shielding electrodes; and wherein the first electrode is positioned between the first and the second shielding electrode, and the second electrode is positioned between the second and the third shielding electrode; and wherein the first electrode is coupled to the first pathway in at least a pair of opposing locations, and wherein the second electrode is coupled to the second pathway in at least a pair of opposing locations, and the plurality of shielding electrodes are coupled to the conductive area in at least a pair of opposing locations.

18. The circuit arrangement of claim 17, in which the circuit arrangement is coupled to an integrated circuit.

19. The circuit arrangement as in claim 17, wherein the material is comprised of any one or more materials selected from a group of materials consisting of a ferrite material, a dielectric material or a varistor material.

20. The circuit arrangement as in claim 17, in which the circuit arrangement is energized.

* * * * *

UNITED STATES PATENT AND TRADEMARK OFFICE
CERTIFICATE OF CORRECTION

| | |
|---|---|
| PATENT NO. | : 6,606,011 B2 |
| APPLICATION NO. | : 09/999787 |
| DATED | : August 12, 2003 |
| INVENTOR(S) | : Anthony A. Anthony, William M. Anthony and Kenneth W. Musil |

It is certified that error appears in the above-identified patent and that said Letters Patent is hereby corrected as shown below:

On the title page, Item (63) reading "Continuation of application No. 09/561,283 filed on Apr. 28, 2000, which is a continuation-in-part of application No. 09/600,530, filed as application No. PCT/US99/01040 on Jan. 16, 1999, and a continuation-in-part of application No. 09/286,812, filed on Apr. 6, 1999, now abandoned, which is a continuation-in-part of application No. 09/056,436, filed on Apr. 7, 1998, now abandoned." should read --Continuation of application No. 09/561,283 filed on Apr. 28, 2000, which is a continuation-in-part of application No. 09/600,530, filed as application No. PCT/US99/01040 on Jan. 16, 1999, and 09/561,283 is also a continuation-in-part of application No. 09/286,812, filed on Apr. 6, 1999, now abandoned, which is a continuation-in-part of application No. 09/056,436, filed on Apr. 7, 1998, now abandoned.--

The first sentence of the specification, Column 1 lines 4-13 reading "This application is a continuation of U.S. patent application Ser. No. 09/561,283 filed Apr. 28, 2000, which is a continuation-in-part of application Ser. No. 09/600,530 filed Jul. 18, 2000, which is a U.S. national stage application of international application PCT/US99/01040 filed Jan. 16, 1999; this application is also a continuation-in-part of U.S. patent application, Ser. No. 09/286,812 filed Apr. 6, 1999, now abandoned, which is a continuation-in-part of U.S. patent application, Ser. No. 09/056,436 filed Apr. 7, 1998, now abandoned." should read

UNITED STATES PATENT AND TRADEMARK OFFICE
CERTIFICATE OF CORRECTION

PATENT NO. : 6,606,011 B2
APPLICATION NO. : 09/999787
DATED : August 12, 2003
INVENTOR(S) : Anthony A. Anthony, William M. Anthony and Kenneth W. Musil It is certified that error appears in the above-identified patent and that said Letters Patent is hereby corrected as shown below:

--This application is a continuation of U.S. patent application Ser. No. 09/561,283 filed Apr. 28,2000, which is a continuation-in-part of application Ser. No. 09/600,530 filed Jul. 18, 2000, which is a U.S. national stage application of international application PCT/US99/01040 filed Jan. 16, 1999; and application Ser. No. 09/561,283 is also a continuation-in-part of U.S. patent application, Ser. No. 09/286,812 filed Apr. 6, 1999, now abandoned, which is a continuation-in-part of U.S. patent application, Ser. No. 09/056,436 filed Apr. 7, 1998, now abandoned.--

Signed and Sealed this

Twelfth Day of February, 2008

JON W. DUDAS
*Director of the United States Patent and Trademark Office*